(12) United States Patent
Hasegawa

(10) Patent No.: US 11,632,886 B2
(45) Date of Patent: Apr. 18, 2023

(54) METHOD OF MANUFACTURING ELECTRONIC MODULE, ELECTRONIC MODULE, AND ELECTRONIC DEVICE

(71) Applicant: CANON KABUSHIKI KAISHA, Tokyo (JP)

(72) Inventor: Mitsutoshi Hasegawa, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 237 days.

(21) Appl. No.: 17/065,026

(22) Filed: Oct. 7, 2020

(65) Prior Publication Data

US 2021/0136967 A1 May 6, 2021

(30) Foreign Application Priority Data

Nov. 6, 2019 (JP) .............................. JP2019-201679

(51) Int. Cl.
*H01L 21/304* (2006.01)
*H01L 23/10* (2006.01)
(Continued)

(52) U.S. Cl.
CPC ..... *H05K 13/0465* (2013.01); *H01L 21/4867* (2013.01); *H01L 21/50* (2013.01);
(Continued)

(58) Field of Classification Search
CPC ...... H05K 3/305; H05K 3/308; H05K 3/3436; H05K 3/3442; H05K 13/0465;
(Continued)

(56) References Cited

U.S. PATENT DOCUMENTS 6,388,321 B1 * 5/2002 Hirai ..................... H01L 24/31
257/737
9,237,686 B2 1/2016 Motomura et al.
(Continued)

FOREIGN PATENT DOCUMENTS

JP 2015-179710 A 10/2015
WO 2014/024338 A1 2/2014

OTHER PUBLICATIONS

Ishiguri et al., U.S. Appl. No. 17/087,102, filed Nov. 2, 2020.

*Primary Examiner* — Xiaoliang Chen
(74) *Attorney, Agent, or Firm* — Venable LLP

(57) ABSTRACT

A method of manufacturing an electronic module includes supplying paste to an electronic component and/or a wiring board. The paste includes solder powder and first resin. The method includes supplying second resin to the electronic component and/or the wiring board. The method includes placing one of the electronic component and the wiring board on another. The method includes curing the second resin to form a second resin portion. The method includes heating the paste to a temperature equal to or higher than a solder melting point after the second resin portion is formed. The method includes solidifying molten solder at a temperature lower than the solder melting point to form a solder portion that bonds the electronic component and the wiring board. The method includes curing the first resin after the solder portion is formed, to form a first resin portion.

12 Claims, 10 Drawing Sheets

(51) Int. Cl.
*H01L 23/24* (2006.01)
*H01L 23/498* (2006.01)
*H01L 25/03* (2006.01)
*H01L 25/16* (2006.01)
*H05K 13/04* (2006.01)
*H01L 23/00* (2006.01)
*H01L 21/50* (2006.01)
*H01L 21/48* (2006.01)
*H01L 27/146* (2006.01)
*H05K 3/34* (2006.01)
*H01L 21/60* (2006.01)

(52) U.S. Cl.
CPC ........ *H01L 24/32* (2013.01); *H01L 27/14634* (2013.01); *H01L 27/14636* (2013.01); *H05K 3/3442* (2013.01); *H01L 2021/60135* (2013.01); *H05K 2201/10977* (2013.01)

(58) Field of Classification Search
CPC ... H01L 21/304; H01L 21/563; H01L 21/565; H01L 21/6835; H01L 23/10; H01L 23/24; H01L 23/498; H01L 23/3157; H01L 23/4985; H01L 23/49811; H01L 24/03; H01L 24/11; H01L 24/13; H01L 24/19; H01L 24/28; H01L 24/32; H01L 24/94; H01L 25/03; H01L 25/16; H01L 25/50; H01L 25/105
USPC ........ 361/743; 257/433, 629, 678, 737, 738, 257/774, 788; 438/106, 109, 113; 29/840, 841
See application file for complete search history.

(56) References Cited

U.S. PATENT DOCUMENTS

| | | | |
|---|---|---|---|
| 10,861,785 B2 | 12/2020 | Ishiguri et al. | |
| 2004/0150118 A1* | 8/2004 | Honda | H01L 24/28 257/E21.503 |

* cited by examiner

METHOD OF MANUFACTURING ELECTRONIC MODULE, ELECTRONIC MODULE, AND ELECTRONIC DEVICE

BACKGROUND OF THE INVENTION

Field of the Invention

The present invention relates to technologies for electronic modules.

Description of the Related Art

An image pickup apparatus that is one example of electronic devices includes an electronic module including an electronic component such as an image sensor. As image pickup apparatuses have been downsized and improved in performance, the electronic components have also been downsized and improved in performance. Most of the electronic components have a semiconductor package, such as a land grid array (LGA) or a leadless chip carrier (LCC), which can downsize the electronic components and allows many terminals to be arranged.

Since these electronic components have lands serving as terminals and disposed on a main surface, the need for the lead terminals can be eliminated and the electronic modules can be downsized. Lands of an electronic component and lands of a wiring board are bonded with each other via solder. However, since the amount of heat generation in the operation of the electronic component has increased as the electronic component has been improved in performance, the solder may break if the electronic component and the wiring board are thermally expanded and stress is applied to the solder. The stress is produced by the difference in the amount of deformation between the electronic component and the wiring board, caused by the thermal expansion. In addition, the solder is required to have resistance not only to the heat, but also to the impact of drop.

WO 2014/024338 describes a manufacturing method of mounting an electronic component on a wiring board by using paste that contains solder powder and uncured thermosetting resin. When such type of paste is heated to a temperature equal to or higher than a solder melting point, the molten solder aggregates and is separated from the uncured thermosetting resin. The uncured thermosetting resin is separated from the solder and moves to the periphery of the solder, and cures through curing reaction caused by heat. The cured product, into which the thermosetting resin has been cured, covers the solder and disperses the stress applied to the solder. The break of the solder can be suppressed in this manner.

However, in the manufacturing method that uses the above-described paste, when a wiring board and an electronic component are bonded with each other via solder in a heating process, the wiring board and/or the electronic component may warp due to the heating, and a failure in bonding of the solder may be caused.

SUMMARY OF THE INVENTION

According to a first aspect of the present invention, a method of manufacturing an electronic module includes supplying paste to an electronic component and/or a wiring board. The paste includes solder powder and first resin. The first resin is uncured thermosetting resin. The method includes supplying second resin to the electronic component and/or the wiring board. The second resin is uncured resin. The method includes placing one of the electronic component and the wiring board on another such that the electronic component and the wiring board sandwich the paste and the second resin. The method includes curing the second resin to form a second resin portion that bonds the electronic component and the wiring board. The method includes heating the paste to a temperature equal to or higher than a solder melting point after the second resin portion is formed, to melt the solder powder. The method includes solidifying molten solder at a temperature lower than the solder melting point to form a solder portion that bonds the electronic component and the wiring board. The method includes curing the first resin after the solder portion is formed, to form a first resin portion that is in contact with the solder portion.

According to a second aspect of the present invention, an electronic module includes a wiring board. The electronic module includes an electronic component including a semiconductor element and an interposer. The electronic module includes a plurality of solder portions disposed such that the solder portions surround a center of the interposer in a plan view, and configured to bond the wiring board and the interposer. The electronic module includes an underfill portion having electrical insulation property, disposed such that the underfill portion surrounds the center of the interposer in a plan view, and configured to be in contact with the plurality of solder portions. The electronic module includes at least one first bonding portion having electrical insulation property and material different from material of the underfill portion, disposed in a first region inside the underfill portion, and configured to bond the interposer and the wiring board.

Further features of the present invention will become apparent from the following description of exemplary embodiments with reference to the attached drawings.

DESCRIPTION OF THE EMBODIMENTS

Hereinafter, some embodiments of the present invention will be described in detail with reference to the accompanying drawings.

First Embodiment

Figure 1:
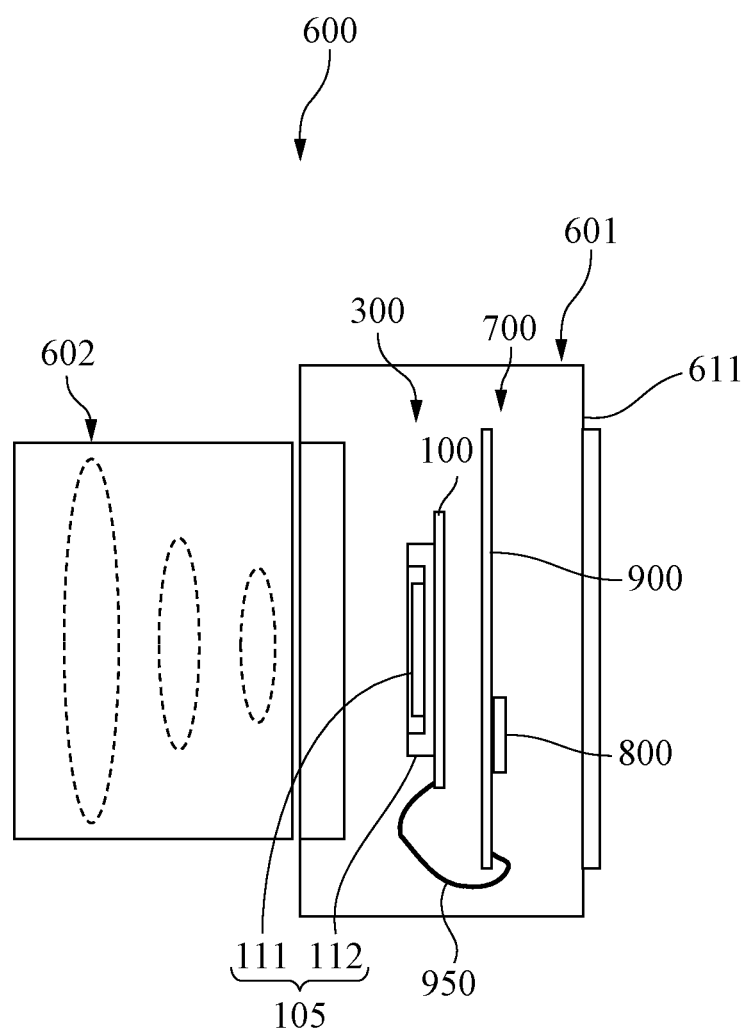
FIG. 1 is a diagram illustrating a digital camera that is one example of electronic devices of a first embodiment.

FIG. 1 is a diagram illustrating a digital camera 600 that is an image pickup apparatus, which is one example of electronic devices of a first embodiment. The digital camera 600 is a digital camera with interchangeable lenses, and includes a camera body 601. A lens unit 602 including the lenses is detachably attached to the camera body 601. The lens unit 602 is a lens barrel. The camera body 601 includes a housing 611, an image pickup module 300, and a processing module 700. The image pickup module 300 and the processing module 700 are disposed in the housing 611. The image pickup module 300 is one example of electronic modules. The image pickup module 300 and the processing module 700 are electrically connected with each other via a cable 950.

The image pickup module 300 includes an image sensor 105 that is one example of electronic components, and a wiring board 100 on which the image sensor 105 is mounted. The wiring board 100 is a printed wiring board and a rigid wiring board. The image sensor 105 is a semiconductor package that is one example of semiconductor devices. The image sensor 105 includes an image pickup device 111 that is one example of semiconductor elements, and an interposer 112 on which the image pickup device 111 is mounted. The interposer 112 is a package substrate.

The image sensor 105 may be a complementary metal oxide semiconductor (CMOS) image sensor or a charge coupled device (CCD) image sensor. The image sensor 105 has a function that converts the light having passed through the lens unit 602, to an electric signal.

The processing module 700 includes an image processing device 800, and a wiring board 900 on which the image processing device 800 is mounted. The image processing device 800 is an electronic component that is a semiconductor package. The wiring board 900 is a printed wiring board and a rigid wiring board. The image processing device 800 is a digital signal processor, for example. The image processing device 800 has a function that receives the electric signal from the image sensor 105, corrects the electric signal, and creates image data from the corrected electric signal.

Figure 2A:
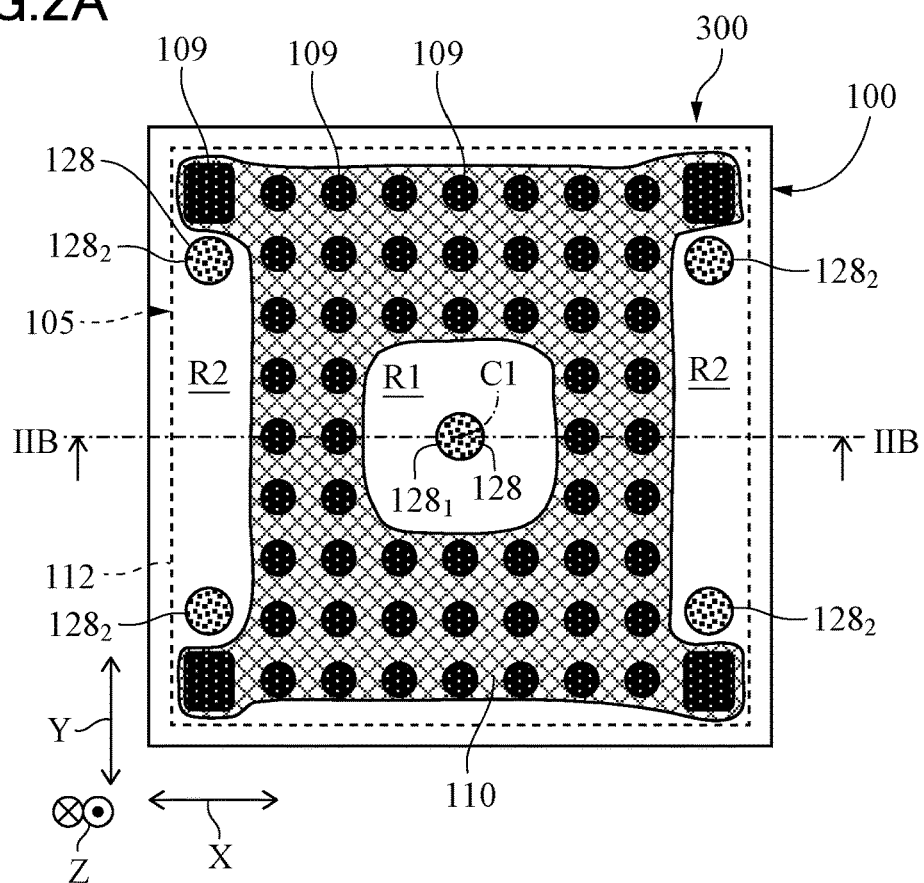
FIG. 2A is a plan view of an image pickup module that is one example of electronic modules of the first embodiment.
Figure 2B:
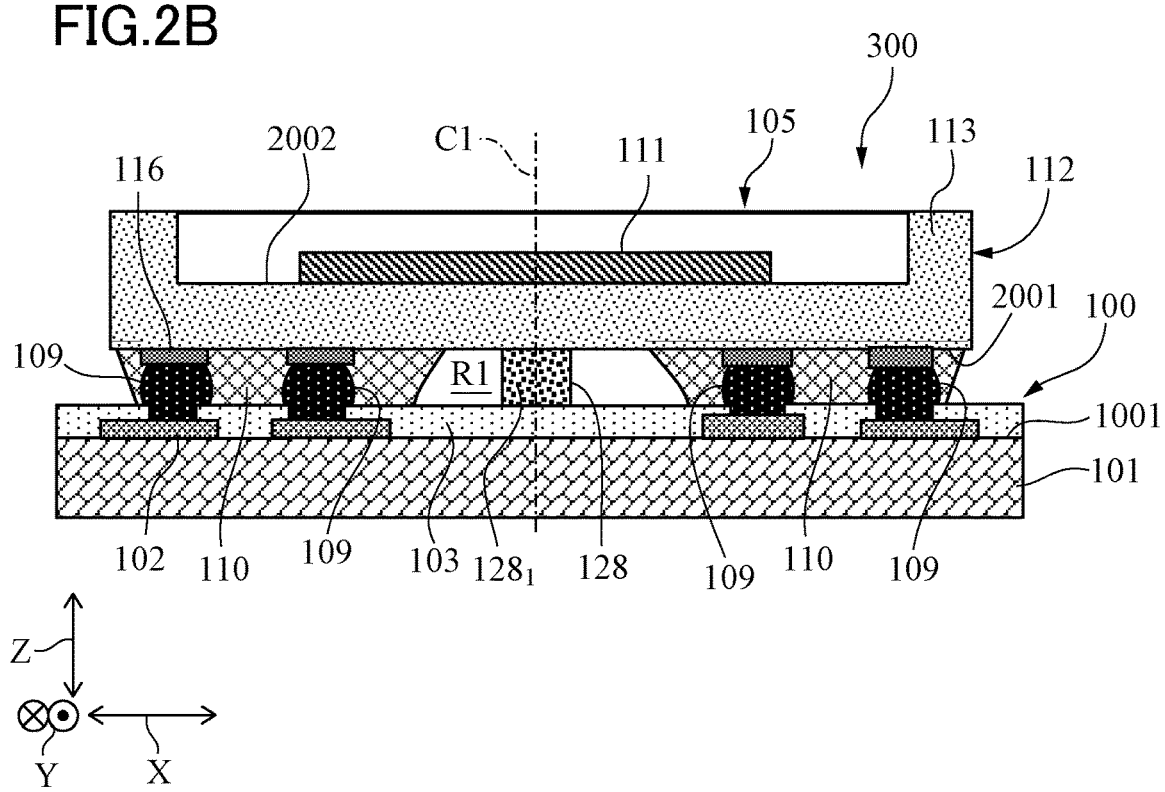
FIG. 2B is a cross-sectional view of the image pickup module of the first embodiment.

FIG. 2A is a plan view of the image pickup module 300 of the first embodiment. FIG. 2A, which is a plan view of the image pickup module 300, illustrates the image pickup module 300 viewed in a Z direction perpendicular to a mounting surface of the wiring board 100, on which the image sensor 105 is mounted. In FIG. 2A, the image sensor 105 is illustrated by a broken line, and the image pickup module 300 seen through the image sensor 105 is schematically illustrated. FIG. 2B is a cross-sectional view of the image pickup module 300 of the first embodiment. FIG. 2B schematically illustrates a cross section of the image pickup module 300, taken along a line IIB-IIB of FIG. 2A.

The image sensor 105 is an LGA semiconductor package. Note that the image sensor 105 may be a ball grid array (BGA) or LCC semiconductor package. The interposer 112 of the image sensor 105 includes an insulating substrate 113 and a plurality of lands 116. The plurality of lands 116 is disposed on a main surface 2001 of the insulating substrate 113. The image pickup device 111 is disposed on a main surface 2002 of the insulating substrate 113 opposite to the main surface 2001. The Z direction is perpendicular to the main surface 2002. Each land 116 is a pad formed by plating the surface of a base body, made of a conductive metal such as copper, with nickel (Ni) and gold (Au). Each land 116 may be a signal land, a power-source land, a ground land, or a dummy land. The insulating substrate 113 may be a ceramic substrate made of ceramics, such as alumina. The shape of the lands 116 viewed in the Z direction is not limited to a particular shape. In the first embodiment, the shape is a circle or a rectangle.

The wiring board 100 includes an insulating substrate 101 and a plurality of lands 102. The plurality of lands 102 is disposed on a main surface 1001 of the insulating substrate 101. The Z direction is perpendicular to the main surface 1001. Each land 102 is a pad made of a conductive metal such as copper. Each land 102 may be a signal land, a power-source land, a ground land, or a dummy land. The insulating substrate 101 is made of an insulating material, such as epoxy resin.

On the main surface 1001, a solder resist film 103 is formed. The solder resist film 103 has openings formed at positions corresponding to the lands 102, for exposing the lands 102. The shape of the lands 102 viewed in the Z direction is not limited to a particular shape. In the first embodiment, the shape is a circle or a rectangle. The lands 102 may be solder mask defined (SMD) lands or non-solder mask defined (NSMID) lands with respect to the solder resist film 103.

The main surface 1001 of the wiring board 100 and the main surface 2001 of the image sensor 105 face each other in the Z direction. The Z direction is an out-of-plane direction of the main surface 2001. An X direction and a Y direction extend along the main surface 2001, and are orthogonal to each other. The X direction and the Y direction, that is, the X and Y directions are in-plane directions of the main surface 2001. The image pickup module 300 includes a plurality of solder portions 109 that electrically and mechanically bonds the image sensor 105 and the wiring board 100. The solder portions 109 electrically and mechanically bond the lands 116 and the lands 102 that face each other.

The image pickup module 300 includes an underfill portion 110 that is disposed between the image sensor 105 and the wiring board 100, and that mechanically bonds the image sensor 105 and the wiring board 100. The underfill portion 110 is made of resin, which is an insulator having electrical insulation property. The underfill portion 110 is a first resin portion that contains resin.

Each of the plurality of solder portions 109 is in contact with the underfill portion 110 formed as one body. Since each solder portion 109 is in contact with the underfill portion 110, the thermal stress caused by the heat generated in the operation of the image sensor 105 can be dispersed not only to the solder portions 109, but also to the underfill portion 110. For example, the area of the main surface 2001 of the image sensor 105 is 900 mm² or more. Even when such a large image sensor 105 is mounted on the wiring board 100, the break of the solder portions 109 caused by the thermal stress can be suppressed.

Preferably, the Vickers hardness of the underfill portion 110 is 17 Hv or more. If the Vickers hardness of the underfill portion 110 is 17 Hv or more, the bonding strength of the solder portions 109 can be sufficiently secured.

When viewed in the Z direction, the external shape of the image sensor 105 is rectangular. The external shape of the image sensor 105 viewed in the Z direction is equal to the external shape of the interposer 112, that is, the external shape of the insulating substrate 113. When viewed in the Z direction, the wiring board 100 is larger than the image sensor 105. When viewed in the Z direction, the whole of the image sensor 105 is in the wiring board 100. When viewed in the Z direction, the plurality of solder portions 109 is in the image sensor, and disposed so as to surround a center C1 of the image sensor 105, that is, a center C1 of the interposer 112. Specifically, when viewed in the Z direction, the plurality of solder portions 109 is disposed so as to surround a rectangular region that includes the center C1 of the interposer 112. When viewed in the Z direction, the center C1 is a centroid of the area of the main surface 2001 of the image sensor 105. In FIG. 2B, the center C1 is indicated by a dot-and-dash imaginary line that extends in the Z direction.

The underfill portion 110 is formed among the plurality of solder portions 109 so as to be in contact with each solder portion 109. When viewed in the Z direction, the underfill portion 110 is disposed so as to surround the center C1. Thus, a region R1 including the center C1 and having no underfill portion 110 is formed inside the underfill portion 110. The region R1 is a first region. When viewed in the Z direction, the region R1 is in the interposer 112 of the image sensor 105. In addition, a region R2 is formed outside the underfill portion 110. Thus, the underfill portion 110 is not formed in the region R2. When viewed in the Z direction, the region R2 is in the interposer 112 of the image sensor 105. The region R2 is a second region.

The image pickup module 300 includes at least one bonding portion disposed between the interposer 112 of the image sensor 105 and the wiring board 100 for mechanically bonding the interposer 112 and the wiring board 100. In the first embodiment, the at least one bonding portion is a plurality of bonding portions 128. In the example of FIG. 2A, five bonding portions 128 are formed. Each of the bonding portions 128 is made of resin, which is an insulator having electrical insulation property. Each of the bonding portions 128 is a second resin portion that contains resin. In the first embodiment, each of the bonding portions 128 is a cured product into which a thermosetting resin has been cured.

Each bonding portion 128 bonds the main surface 2001 of the image sensor 105 and the solder resist film 103 of the wiring board 100. Each bonding portion 128 functions as a member that suppresses the change in distance between the image sensor 105 and the wiring board 100 in the manufacturing process for the image pickup module 300.

The plurality of bonding portions 128 is made of an identical resin material. When viewed in the Z direction, at least one of the plurality of bonding portions 128 is disposed in the region R1. The plurality of bonding portions 128 include one bonding portion $128_1$ disposed in the region R1 when viewed in the Z direction, and a plurality of bonding portions $128_2$ disposed in the region R2 when viewed in the Z direction. In the example of FIG. 2A, four bonding portions $128_2$ are formed. The bonding portion $128_1$ is a first bonding portion, and the bonding portions $128_2$ are a second bonding portion. Preferably, the bonding portion $128_1$ is disposed at a position that overlaps with the center C1 when viewed in the Z direction.

Note that although each bonding portion 128 bonds the main surface 2001 of the insulating substrate 113 of the image sensor 105 and the solder resist film 103 of the wiring board 100 in the present embodiment, the present disclosure is not limited to this. For example, some of the plurality of bonding portions 128 may bond the main surface 1001 or lands 102 of the wiring board 100 and lands 116.

The Vickers hardness of the bonding portions 128 is preferably 20 Hv or more for keeping the distance between the image sensor 105 and the wiring board 100 and reducing the stress applied to the solder portions 109 in the heating process of the manufacturing process. In addition, it is preferable that the bonding portions 128 be harder than the underfill portion 110 for reducing the stress applied to the solder portions 109 when the thermal shock or the impact of drop is applied to the image pickup module 300. This is because if the bonding portions are softer than the underfill portion, the impact reduction effect by the bonding portions becomes smaller and the impact applied to the underfill portion and the solder portions becomes large. That is, it is preferable that the Vickers hardness of the bonding portions 128 be higher than the Vickers hardness of the underfill portion 110. In other words, it is preferable that the Vickers hardness of the underfill portion 110 be lower than the Vickers hardness of the bonding portions 128.

Next, a method of manufacturing the image pickup module 300 will be described. FIGS. 3A, 3B, 3C, 3D, 4A, 4B, 4C, and 4D are diagrams illustrating the method of manufacturing the image pickup module 300 of the first embodiment.

Figure 3A:
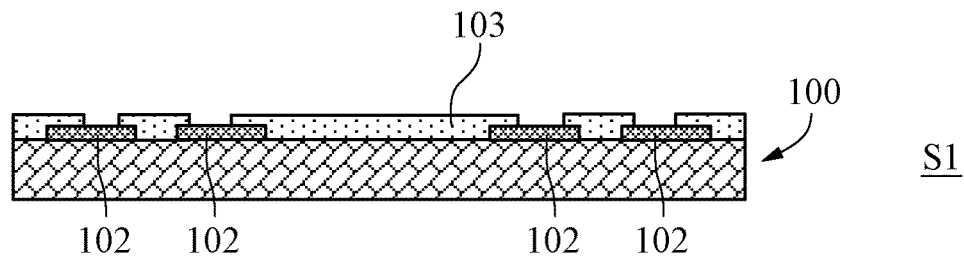
FIG. 3A is a diagram illustrating a method of manufacturing the image pickup module of the first embodiment.

FIG. 3A is a diagram illustrating a process S1 in which members used for manufacturing the image pickup module 300 are prepared. As illustrated in FIG. 3A, in the process S1, the wiring board 100 is prepared. Note that although not illustrated in FIG. 3A, the image sensor 105 is also prepared in the process S1.

Figure 3B:
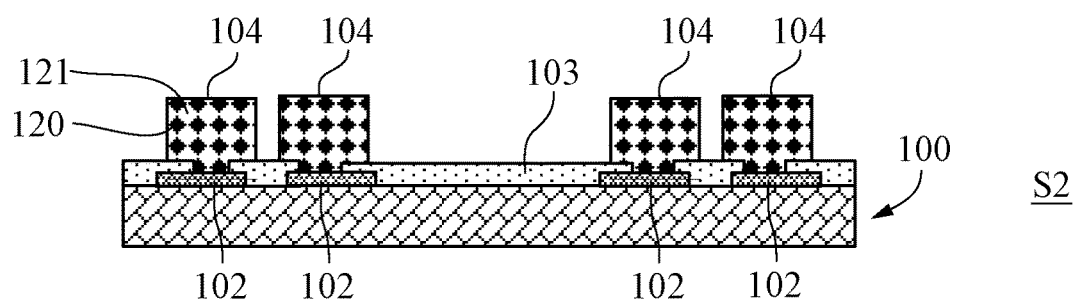
FIG. 3B is a diagram illustrating the method of manufacturing the image pickup module of the first embodiment.

FIG. 3B is a diagram illustrating a process S2 in which paste 104 is supplied onto the lands 102. As illustrated in FIG. 3B, in the process S2, the paste 104 is supplied onto each of the lands 102. The paste 104 contains solder powder 120 and first resin 121 that is uncured thermosetting resin. The first resin 121 contains base resin and curing agent. The paste 104 may also contain a flux component used for solder bonding. The paste 104 may be applied onto the lands 102 through screen printing or by a dispenser. As illustrated in FIG. 3B, the paste 104 is supplied onto the lands 102 so as to cover the whole portion of each land 102 that is exposed from the solder resist film 103. The thermosetting resin that serves as the first resin 121 may be gradually cured after softened once or without softened, by heating.

Note that as in so-called offset printing, the paste 104 may be supplied onto the lands 102 so as to cover part of the portion (exposed from the solder resist film 103) of each land 102. In another case, the paste 104 may be supplied onto the lands 116, instead of being supplied onto the lands 102. In still another case, the paste 104 may be supplied to part or all of the plurality of lands 102 and part or all of the plurality of lands 116. That is, the paste 104 has only to be supplied onto the image sensor 105 and/or the wiring board 100 so as to be sandwiched between the lands 102 and the lands 116 in the following process S4 of FIG. 3D.

Figure 3C:
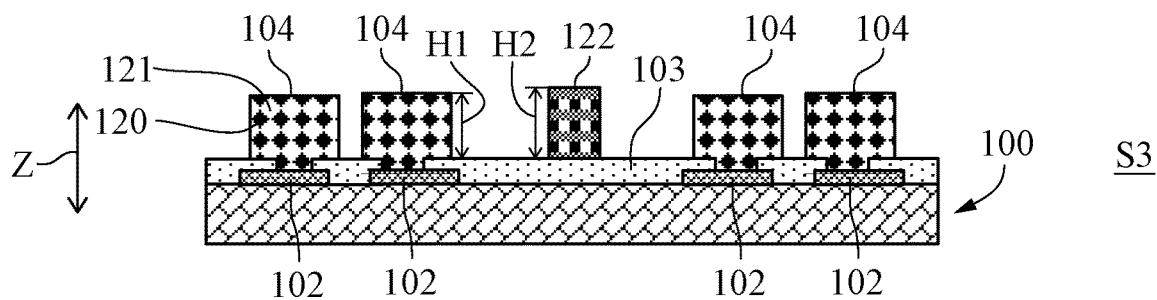
FIG. 3C is a diagram illustrating the method of manufacturing the image pickup module of the first embodiment.

FIG. 3C is a diagram illustrating a process S3 in which second resin 122 is supplied. The second resin 122 is uncured resin. As illustrated in FIG. 3C, in the process S3, the second resin 122 is supplied onto the wiring board 100. Note that although FIG. 3C illustrates the second resin 122 supplied to a single position, the second resin 122 is supplied to a plurality of positions at which the plurality of bonding portions 128 of FIG. 2A is to be formed.

The second resin 122 is uncured resin, and is a precursor of the bonding portions 128 illustrated in FIG. 2B. The second resin 122 is uncured resin that is different from the first resin 121. When the second resin 122 and the first resin 121 are heated under the same temperature condition, the start temperature of curing of the second resin 122 is lower than that of the first resin 121. Alternatively, in a case where the first resin 121 and the second resin 122 start to cure at the same temperature when heated under the same temperature condition, the curing speed of the second resin 122 is higher than that of the first resin 121 when heated under the same temperature condition. The second resin 122 contains base resin and a curing agent whose type is different from the curing agent of the first resin 121. Alternatively, the curing speed may be changed by changing the content rate of the curing agent. The base resin of the second resin 122 may or may not be the same type as that of the base resin of the first resin 121.

The second resin 122 is applied to portions of the wiring board 100, by a dispenser, other than the portions to which the paste 104 has been supplied. In this process, the second resin 122 is applied to the portions of the wiring board 100 so as not to contact the paste 104 on the wiring board 100. In the first embodiment, the second resin 122 is applied onto the solder resist film 103. In the process S3, it is preferable that a height H2 of the second resin 122 in the Z direction is equal to or higher than a height H1 of the paste 104 in the Z direction for allowing the second resin 122 to easily contact the image sensor 105 in the process performed after the process S3. In the first embodiment, the heights H1 and H2 are determined with respect to the surface of the solder resist film 103 of the wiring board 100. Preferably, the viscosity of the second resin 122 is 10,000 Pa·S or more at a room temperature (23±2° C.). If the viscosity is in this range, the second resin 122 can be prevented from spreading on the wiring board 100, and the height H2 can be made equal to or higher than the height H1.

Note that the second resin 122 may be supplied to the main surface 2001 of the image sensor 105. In this case, the second resin 122 may be supplied to the main surface 2001 by a dispenser or through screen printing. That is, the second resin 122 has only to be supplied onto the image sensor 105 and/or the wiring board 100. In a case where the paste 104 and the second resin 122 are supplied to the image sensor 105, the heights H1 and H2 are determined with respect to the main surface 2001. In addition, the process S2 and the process S3 may be reversed in order, or performed simultaneously.

Figure 3D:
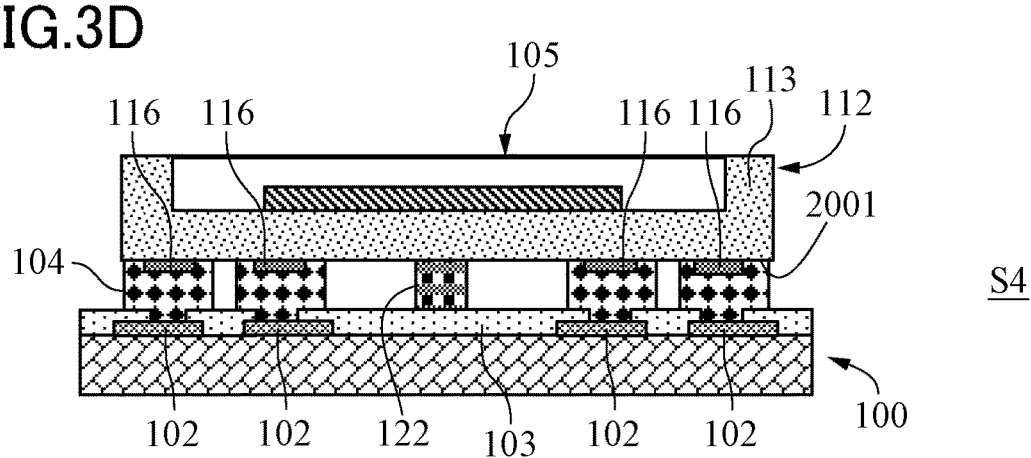
FIG. 3D is a diagram illustrating the method of manufacturing the image pickup module of the first embodiment.

FIG. 3D is a diagram illustrating a process S4 in which the image sensor 105 is placed on the wiring board 100 to which the paste 104 and the second resin 122 have been supplied. In the process S4, the image sensor 105 is placed on the wiring board 100 by using a mounter (not illustrated). In this process, the image sensor 105 is positioned so that each land 116 of the image sensor 105 contacts the paste 104 on a corresponding land 102 of the wiring board 100. In the process S4, the second resin 122 contacts the main surface 2001 of the insulating substrate 113 of the image sensor 105. Thus, the paste 104 and the second resin 122 are sandwiched between the image sensor 105 and the wiring board 100. That is, the image sensor 105 is placed on the wiring board 100 such that the paste 104 and the second resin 122 are sandwiched between the image sensor 105 and the wiring board 100.

Note that although the description has been made for the case where the image sensor 105 is placed on the wiring board 100 in the process S4, the operation may be performed in a reverse manner. Specifically, the wiring board 100 may be placed on the image sensor 105. That is, one of the image sensor 105 and the wiring board 100 has only to be placed on the other.

After the process S4, the image sensor 105 and the wiring board 100 sandwiching the paste 104 and the second resin 122 are conveyed into a reflow furnace (not illustrated), which is one example of heating furnaces.

The paste 104, the second resin 122, the image sensor 105, and the wiring board 100 conveyed into the reflow furnace are heated by the atmosphere in the reflow furnace. Processes S5-1, S5-2, S5-3, and S5-4 illustrated in FIGS. 4A, 4B, 4C, and 4D illustrate part of a series of heating processes, on a time-series basis.

Figure 4A:
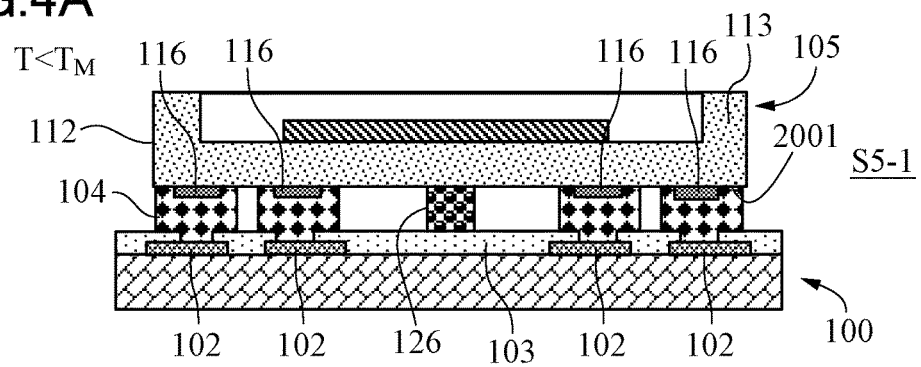
FIG. 4A is a diagram illustrating the method of manufacturing the image pickup module of the first embodiment.

When heating is started, that is, when the temperature of the atmosphere in the reflow furnace is started to increase, the second resin 122 is heated by the atmosphere in the reflow furnace, and the temperature of the second resin 122 is started to increase, so that the curing reaction starts. When a temperature T of the atmosphere in the reflow furnace is further increased so that the temperature T is made closer to a solder melting point $T_M$, the curing reaction of the second resin 122, that is, the cross-linking reaction of the second resin 122 proceeds. The solder melting point $T_M$ is a melting point of the solder powder 120. FIG. 4A illustrates the process S5-1 in which the temperature T of the atmosphere in the reflow furnace is being increased to the solder melting point $T_M$. The second resin 122 illustrated in FIG. 3D becomes an intermediate 126 of FIG. 4A when the curing reaction proceeds. When the temperature T of the atmosphere in the reflow furnace is further increased so that the temperature T is made closer to the solder melting point $T_M$, the intermediate 126 cures and becomes the bonding portion 128. In this manner, during the process in which the temperature of the paste 104 is increased to the solder melting point $T_M$, the second resin 122 is cured. By thermally curing the second resin 122, the bonding portion 128 is formed.

Figure 4B:
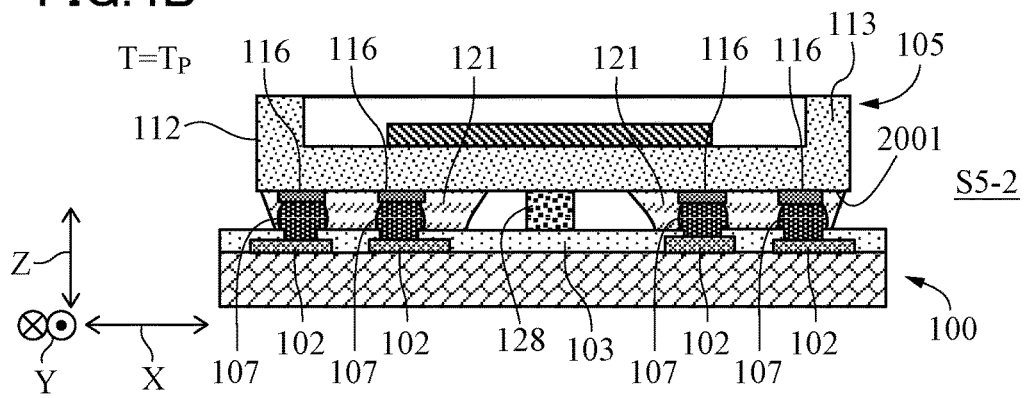
FIG. 4B is a diagram illustrating the method of manufacturing the image pickup module of the first embodiment.

FIG. 4B illustrates the process S5-2 in which the temperature T of the atmosphere in the reflow furnace is increased to a peak temperature $T_p$ that is higher than the solder melting point $T_M$. In the process S5-2, the paste 104 is heated to the peak temperature $T_p$, which is higher than the solder melting point $T_M$. With this operation, the solder powder 120 melts and aggregates, so that a molten solder 107 and the first resin 121 are separated from each other. The bonding portion 128 is in an almost solid-phase state in which the curing rate is 50% or more. The molten solder 107 is in a liquid-phase state. The first resin 121 is in a liquid-phase state in which the curing rate is less than 50%. Note that the peak temperature $T_p$ is appropriately set such that the curing reaction of the first resin 121 does not proceed excessively. In the first embodiment, when it is described that the first resin 121 cures or becomes a cured product, it means that the curing rate of the first resin 121 becomes 50% or more. Similarly, when it is described that the second resin 122 cures or becomes a cured product, it means that the curing rate of the second resin 122 becomes 50% or more.

The bonding portion 128 serves as a pillar that bonds the main surface 2001 of the image sensor 105 and the solder resist film 103 of the wiring board 100, and keeps the distance between the image sensor 105 and the wiring board 100. Since the distance between the image sensor 105 and the wiring board 100 is kept by the bonding portion 128 in the process S5-2, failure in bonding, such as a short circuit or an open circuit, of the later-formed solder portions 109 can be prevented. Therefore, the reliability of the bonding for the manufactured image pickup module 300 can be improved.

In addition, since the distance between the image sensor 105 and the wiring board 100 is kept almost constant by the bonding portion 128 in the X and Y directions in the process S5-2, the flow of the first resin 121 caused by the capillary phenomenon can be suppressed. Thus, the first resin 121 can remain around the molten solder 107.

Figure 4C:
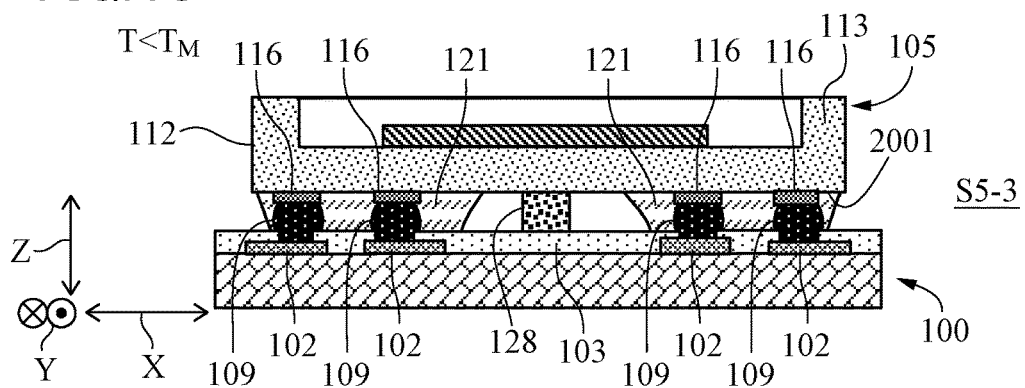
FIG. 4C is a diagram illustrating the method of manufacturing the image pickup module of the first embodiment.

FIG. 4C illustrates a process S5-3 in which the molten solder 107 is solidified. In the process S5-3, the molten solder 107 is cooled after the process S5-2, from the peak temperature $T_p$ to a temperature lower than the solder melting point $T_M$, so that the molten solder 107 is solidified. By exposing the molten solder 107, in the reflow furnace, to the atmosphere having a temperature lower than the solder melting point $T_M$, the molten solder 107 is solidified, and the solder portions 109 that electrically and mechanically bond the image sensor 105 and the wiring board 100 are formed. The solder portions 109 are in a solid-phase state.

In the process S5-3, although the cross-linking reaction of the first resin 121 proceeds more than in the process S5-2 of FIG. 4B, the first resin 121 still has a high fluidity and a curing rate of less than 50%. In the process S5-3, the warpage of the image sensor 105 and the wiring board 100 is prevented by the bonding portion 128. That is, the distance between the image sensor 105 and the wiring board 100 is kept almost constant in the X and Y directions by the bonding portion 128. Thus, the flow of the first resin 121 caused by the capillary phenomenon can be suppressed, and the first resin 121 can remain around the solder portions 109.

Figure 4D:
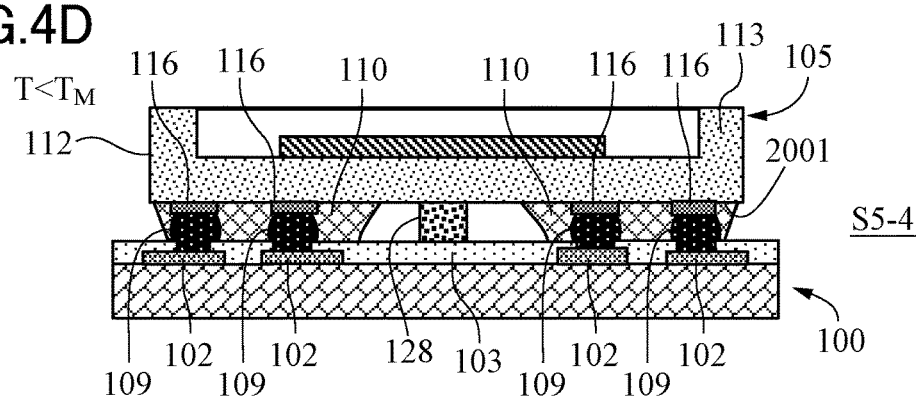
FIG. 4D is a diagram illustrating the method of manufacturing the image pickup module of the first embodiment.

FIG. 4D is a diagram illustrating the process S5-4 in which the first resin 121 is cured. In the process S5-4, the first resin 121 is further heated after the process S5-3, by the atmosphere having a temperature lower than the solder melting point $T_M$. With this operation, the curing rate of the first resin 121 further increases, and the curing reaction proceeds, so that the underfill portion 110 is formed. The underfill portion 110 is a cured product of the first resin 121. The underfill portion 110 formed by thermally curing the first resin 121 is in a solid-phase state. By curing the first resin 121 remains around the solder portions 109, the solder portions 109 are covered and reinforced by the underfill portion 110. Therefore, the reliability of the bonding for the image pickup module 300 is improved.

The process S5-4 can be performed in the same reflow furnace as that used in the processes S5-1 to S5-3. By the way, wiring boards 100 on which image sensors 105 are mounted are conveyed into the reflow furnace one after another. If the time necessary for the process S5-4 cannot be secured in the reflow furnace in terms of productivity, the first resin 121 may be thermally cured in another heating furnace such as a batch furnace. By using the above-described manufacturing method, the image pickup module 300 is manufactured.

By the way, the bonding portions $128_1$ and $128_2$ illustrated in FIG. 2A play a supplementary role to keep the distance between the image sensor 105 and the wiring board 100 in the heating process. For this reason, the total volume of the bonding portions $128_1$ and $128_2$ is preferably smaller than the total volume of the underfill portion 110. That is, the total volume of the second resin 122 supplied to the wiring board 100 in the process S3 of FIG. 3C is preferably smaller than the total volume of the paste 104 supplied to the wiring board 100 in the process S2 of FIG. 3B.

Next, a method of evaluating the curing rate of the first resin 121 and the second resin 122 will be described. The curing rate of the first resin 121 and the second resin 122 can be evaluated from a measurement value obtained by a rigid-body pendulum type physical properties testing instrument, that is, a viscoelasticity testing instrument, for example. Specifically, the curing rate of resin can be calculated from a period of damped free oscillation of a rigid-body pendulum that changes with the change in curing rate of the resin. The rigid-body pendulum type physical properties testing instrument may be a general-purpose instrument, such as RPT-3000 W made by A&D Company, Limited.

Figure 5:
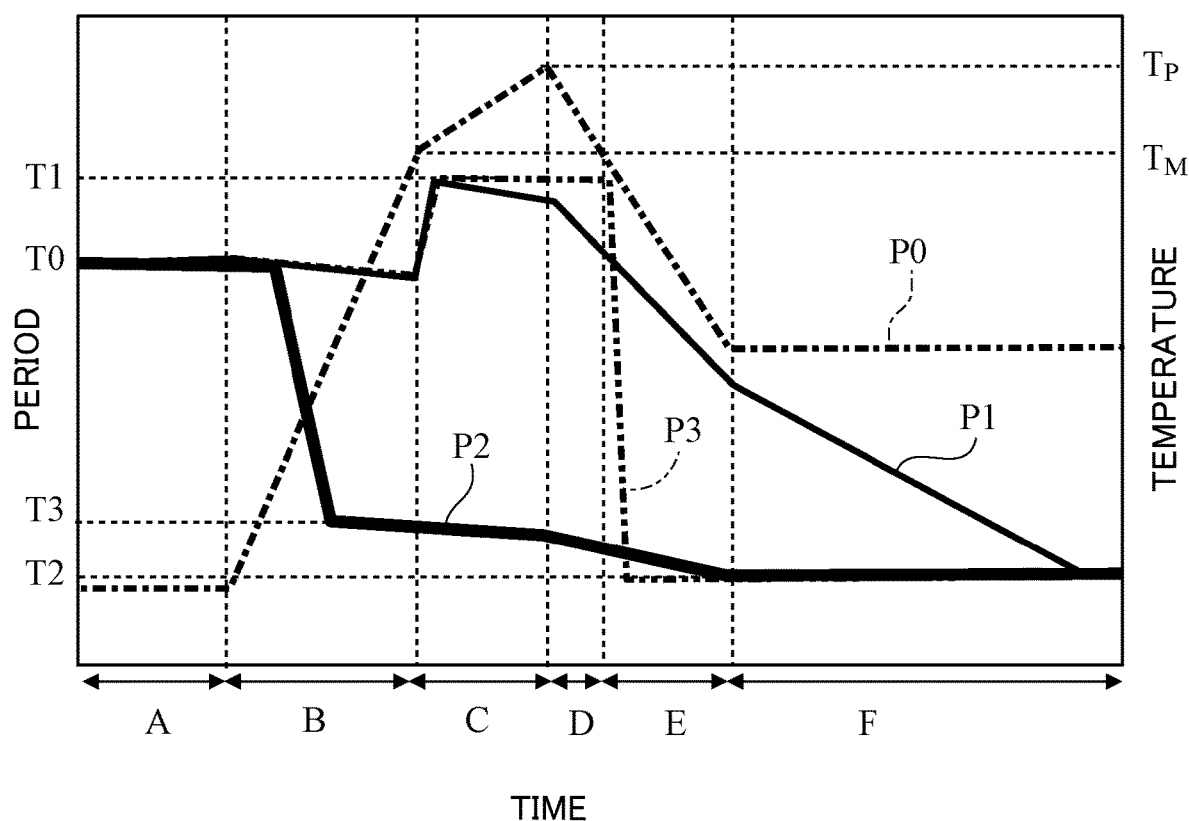
FIG. 5 is a diagram illustrating a heating process in the method of manufacturing the image pickup module of the first embodiment.

Next, a temperature profile of the atmosphere in the reflow furnace and a profile of the period of oscillation of the rigid-body pendulum will be described. The temperature profile is used for the heating process. FIG. 5 is a diagram illustrating a temperature profile P0 and profiles P1 to P3 of the period of oscillation of the rigid-body pendulum in the heating process of the first embodiment. In FIG. 5, the temperature profile P0 is indicated by a dot-and-dash line. In addition, the profiles P1 and P2 of the period of oscillation of the rigid-body pendulum for the resins 121 and 122 are illustrated together with the temperature profile P0 in FIG. 5. The profile P1 of the period of oscillation of the rigid-body pendulum for the resin 121 is indicated by a thin solid line, and the profile P2 of the period of oscillation of the rigid-body pendulum for the resin 122 is indicated by a thick solid line. In FIG. 5, the profile P3 of the period of oscillation of the rigid-body pendulum for the solder is indicated by an alternate long and two short dashed line. In FIG. 5, the horizontal axis represents the time, and the vertical axis represents the temperature of the wiring board 100, or the period of oscillation of the rigid-body pendulum. Hereinafter, the description will be made with reference to the profiles P0, P1, P2, and P3 illustrated in FIG. 5.

When the process S4 of FIG. 3D is completed, the wiring board 100 on which the image sensor 105 is mounted is conveyed into the reflow furnace (not illustrated). In FIG. 5, a time period A is a period of time from when the wiring board 100 on which the image sensor 105 is mounted is conveyed into the reflow furnace, until when the heating is started. In the time period A, the temperature is constant at around room temperature (23±2° C.).

In the time period A, since the temperature is constant at around room temperature (23±2° C.), and the curing rate of the resins 121 and 122 does not change, the period of oscillation of the rigid-body pendulum for the resins 121 and 122 has a constant value of T0. The resins 121 and 122 are in an uncured liquid-phase state, and have high fluidity.

In a time period B, the temperature of the interior of the reflow furnace is increased, and thereby the wiring board 100 is heated so that the temperature of the wiring board 100 reaches the solder melting point $T_M$. The heating rate in the time period B is not limited to a particular value, but preferably, is equal to or lower than 2.5° C./sec. If the heating rate is too high and higher than 2.5° C./sec, the overshoot in temperature will easily occur. In addition, if the heating rate is too high and higher than 2.5° C./sec, the difference in temperature distribution of the wiring board 100 increases in the X and Y directions, and the difference in temperature distribution of the wiring board 100 between the front surface and the back surface also increases. As a result, the warpage of the wiring board 100 may increase. In contrast, if the heating rate is too low, the throughput decreases. Thus, the heating rate is preferably 0.5° C./sec or more.

In the time period B, as the heating temperature increases, the second resin 122 starts the curing reaction, and becomes a half-cured body that is the intermediate 126 illustrated in FIG. 4A. As the curing reaction of the second resin 122 proceeds, the main surface 2001 of the image sensor 105 and the solder resist film 103 of the wiring board 100 are gradually bonded with each other.

In the time period B, since the curing reaction of the second resin 122 proceeds, the period of oscillation of the rigid-body pendulum becomes short. The fluidity of the second resin 122 tends to decrease as the curing reaction proceeds. Thus, an initial period T0 is longest in the period of oscillation for the second resin 122. When the period is T0, the curing rate of the second resin 122 is 0%. During the time period B, the period of oscillation for the second resin 122 is shortened to T3, and the curing rate of the second resin 122 reaches 80%. By the end of a time period B, the curing rate of the second resin 122 becomes 50% or more, and the bonding portion 128 that is the second resin 122 is formed.

In contrast, the curing reaction of the first resin 121 of the paste 104 proceeds gradually in the time period B, and the period of oscillation of the rigid-body pendulum decreases slightly with respect to the initial period T0. That is, the fluidity of the first resin 121 tends to decrease slightly.

In the time period B, even if the heating rate is in a range from 0.5 to 2.5° C./sec, the wiring board 100 and the image sensor 105 are applied with the stress that is caused by the difference in temperature distribution, and that would cause the wiring board 100 and the image sensor 105 to warp. However, since the wiring board 100 and the image sensor 105 are bonded with each other via the almost solid-phase bonding portion 128, the warpage of the wiring board 100 and the image sensor 105 is suppressed, and the distance between the wiring board 100 and the image sensor 105 is kept almost constant in the X and Y directions.

If the curing rate of the second resin 122 is 50% or more, the bonding portion 128 is in an almost solid-phase state. The bonding force of the bonding portion 128 that bonds the wiring board 100 and the image sensor 105 is stronger than the force that warps the wiring board 100 and the image sensor 105. Thus, the distance between the wiring board 100 and the image sensor 105 is kept almost constant in the X and Y directions by the plurality of bonding portions 128. For increasing the bonding force of the bonding portions 128, it is more preferable that the curing rate of the second resin 122 is 80% or more. Note that in the time period B, the curing rate of the first resin 121 contained in the paste 104 is less than 50%, and thus the first resin 121 is still uncured.

In a time period C, the temperature of the interior of the reflow furnace is further increased, and thereby the wiring board 100 is heated so that the temperature of the wiring board 100 reaches the peak temperature $T_P$ from the solder melting point $T_M$. With this operation, the solder powder 120 of the paste 104 melts and aggregates, so that the molten solder 107 and the first resin 121 are separated from each other.

The peak temperature $T_p$ is set such that the first resin 121 does not cure before the molten solder 107 solidifies in a later-described time period D. Preferably, the peak temperature $T_p$ is equal to or lower than 1.25 times the solder melting point $T_M$.

Preferably, the heating rate in the time period C is lower than that in the time period B. For example, the heating rate in the time period C is preferably equal to or higher than 0.1° C./sec and equal to or lower than 1.0° C./sec. If the heating rate in the time period C is lower than that in the time period B, the solder powder 120 melts slowly, and the molten solder 107 wets and spreads on the whole of each of the lands 102.

In the time period C, part of the first resin 121 starts the cross-linking reaction, or the curing reaction. In this time, the period of oscillation of the rigid-body pendulum reaches the longest period T1. The curing rate of the first resin 121 obtained when the period is T1 is 0%. That is, the fluidity of the first resin 121 once increases because the viscosity decreases from a value obtained before the first resin 121 is heated, and then decreases gradually through the cross-linking reaction.

On the other hand, the curing reaction of the second resin 122 further proceeds in the time period C. Since the glass-transition point of the second resin 122 is lower than the solder melting point $T_M$, the period of oscillation of the rigid-body pendulum may increase from the period T3 in the time periods B and C. However, the second resin 122 has only to keep the bonding force that keeps the distance between the wiring board 100 and the image sensor 105 until the solder solidifies.

The molten solder 107 is in a liquid-phase state. The curing rate of the first resin 121 is 10% or less, and the first resin 121 is in a liquid-phase state. Since the first resin 121 is in a liquid-phase state, the first resin 121 would easily flow toward a narrow space due to the capillary phenomenon. In the time period C, however, since the wiring board 100 and the image sensor 105 are bonded with each other via the solid-phase bonding portions 128, and the distance between the wiring board 100 and the image sensor 105 is kept almost constant. Thus, the flow of the liquid-phase first resin 121 caused by the capillary phenomenon is prevented. In this manner, the solder portions 109, into which the molten solder will be solidified later, can be fully covered by the underfill portion 110.

When the solder powder 120 melts in the time period C, the oxide film that covers the solder powder 120 is reduced and removed by the flux, which is contained in the paste 104.

In the time period D, the temperature of the reflow furnace is decreased, and thereby the wiring board 100 is cooled so that the temperature of the wiring board 100 decreases from the peak temperature $T_P$ to a temperature lower than the solder melting point $T_M$. By cooling the molten solder 107 at a temperature lower than the solder melting point $T_M$, the molten solder 107 is solidified, and the lands 102 and the lands 116 are electrically and mechanically bonded with each other via the solder portions 109.

The heating rate in the time period D is not limited to a particular value, but preferably, is higher than that in the time period C. For example, the heating rate in the time period D is equal to or higher than 0.5° C./sec and equal to or lower than 2.0° C./sec. More preferably, the heating rate in the time period D is equal to or higher than double the heating rate in the time period C.

In the time period D, the cross-linking reaction of the first resin 121 further proceeds, and the curing rate or the hardness of the first resin 121 increases gradually. Preferably, the curing rate of the first resin 121 in the time periods C and D is less than 50%. That is, in the first embodiment, the total time of the time period C and the time period D is made shorter than the time in which the first resin 121 cures, so that the molten solder 107 solidifies before the first resin 121 cures.

In the time periods C and D, when the molten solder 107 aggregates, the molten solder 107 produces gas, such as water vapor and carbon dioxide gas. The produced gas forms a void in the first resin 121, and the gas expands in the void. At a temperature equal to or higher the solder melting point $T_M$, the solder keeps its molten state.

In the time periods C and D, since the first resin 121 has high fluidity, the gas produced by the aggregation of the molten solder 107 forms a void in the first resin 121, and breaks the first resin 121 and flows into the outside air. However, since the broken first resin 121 has high fluidity, the broken portion of the first resin 121 closes soon. Thus, the molten solder 107 does not flow out of the first resin 121. In addition, since the first resin 121 has high fluidity, even if one portion is separated from an aggregation of the molten solder 107, the one portion can join with the aggregation of the molten solder 107 again. Note that the gas produced when the molten solder 107 solidifies is enclosed in the solder portions 109.

In the time period D, the cross-linking reaction of the first resin 121 further proceeds, and the period of oscillation of the rigid-body pendulum for the first resin 121 becomes shorter than the period T1. Since there is the interaction between the molten solder 107 and the first resin 121 in the time period D, the period of oscillation of the rigid-body pendulum for the first resin 121 will further shorten in the following time period E.

For allowing the first resin 121 to keep high fluidity, the curing rate of the first resin 121 in the time period D is preferably 30% or less, and more preferably, 10% or less.

In the time period E, the temperature of the reflow furnace is further decreased to a temperature lower than the solder melting point $T_M$. In the time period E, the solder is solidified, and the cross-linking reaction of the first resin 121 further proceeds, gradually increasing the curing rate. Since the solder is in a solid state in the time period E, the interaction between the solder and the first resin 121 is not produced. Thus, as the cross-linking reaction of the first resin 121 proceeds, the period of oscillation of the rigid-body pendulum for the first resin 121 becomes shorter than the period in the time period D. The curing rate of the first resin 121 in the time period E is preferably 40% or less, and more preferably, 20% or less.

In a time period F, the temperature of the interior of the reflow furnace is kept at a temperature lower than the solder melting point $T_M$ and equal to or higher than a temperature at which the first resin 121 and the second resin 122 start the cross-linking reaction. With this operation, the temperature of the wiring board 100 becomes the temperature lower than the solder melting point $T_M$, and the cross-linking reaction of the first resin 121 and the second resin 122 proceeds.

In this manner, the heating to the resins 121 and 122 is continued in the time period F, and thereby the resins 121 and 122 are completely cured. When it is described that the first resin 121 is completely cured, it means that the curing rate of the first resin 121 becomes 90% or more. Similarly, when it is described that the second resin 122 is completely cured, it means that the curing rate of the second resin 122 becomes 90% or more.

In the time period F, since the temperature of the interior of the reflow furnace is kept at a constant temperature lower than the solder melting point $T_M$, the cross-linking reaction of the first resin 121 and the second resin 122 continues to proceed. Thus, the period of oscillation of the rigid-body pendulum for the first and the second resins 121 and 122 becomes shorter than the period in the time period E. Finally, the cross-linking reaction completes, and the period of oscillation of the rigid-body pendulum becomes constant at T2. In this state, the resins 121 and 122 are in a complete solid-phase state. Thus, the curing rate in this state is 100%.

The Vickers hardness of the underfill portion 110 formed by completely curing the first resin 121, and the Vickers hardness of the bonding portion 128 formed by completely curing the second resin 122 are 17 Hv or more. If the Vickers hardness of the underfill portion 110 and the bonding portion 128 is 17 Hv or more, the bonding strength can be sufficiently secured.

Preferably, the Vickers hardness of the bonding portion 128 is higher than the Vickers hardness of the underfill portion 110 and is 20 Hv or more. For completely curing the first resin 121 in a short time in the time period F, it is preferable that the temperature of the interior of the reflow furnace, that is, the temperature of the wiring board 100 be equal to or higher than 0.8 times the solder melting point $T_M$ and equal to or lower than 0.95 times the solder melting point $T_M$.

Note that although the temperature of the reflow furnace is kept constant in the time period F, the temperature of the reflow furnace may be changed. However, if the cross-linking reaction of the first resin 121 is allowed to proceed at a constant temperature and in a sufficient period of time, variations in reaction can be suppressed. In a case where the wiring board 100 and the image sensor 105 have a large size, the temperature distribution on the wiring board 100 and the image sensor 105 tends to be uneven. Thus, preheating may be performed in the heating process for achieving even temperature distribution.

In addition, although the description has been made for the method in which the curing rate of resin is calculated by using the rigid-body pendulum type viscoelasticity testing instrument, the present disclosure is not limited to this. For example, the curing rate of resin may be calculated by using an apparatus, such as a differential scanning calorimeter (DSC) or a nano indenter.

Second Embodiment

Figure 6:
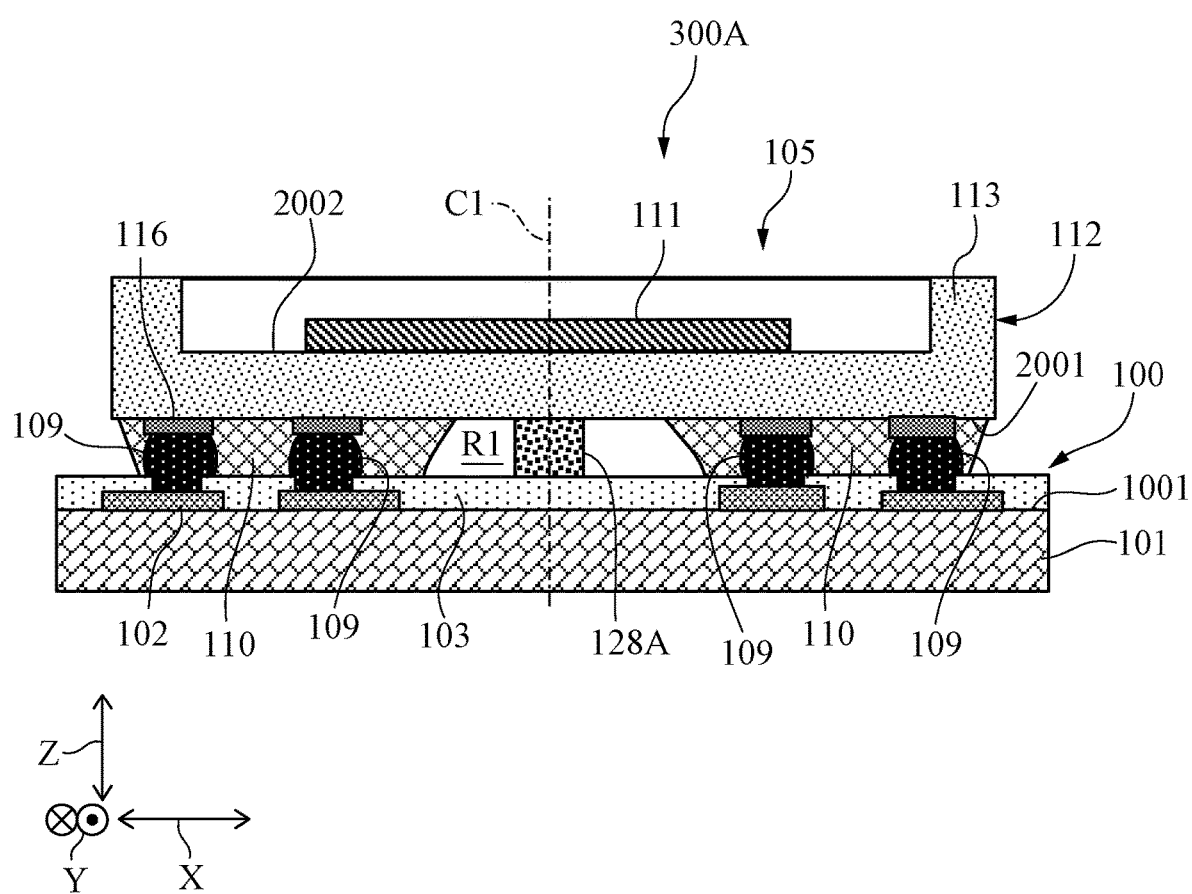
FIG. 6 is a cross-sectional view of an image pickup module of a second embodiment.
Figure 7A:
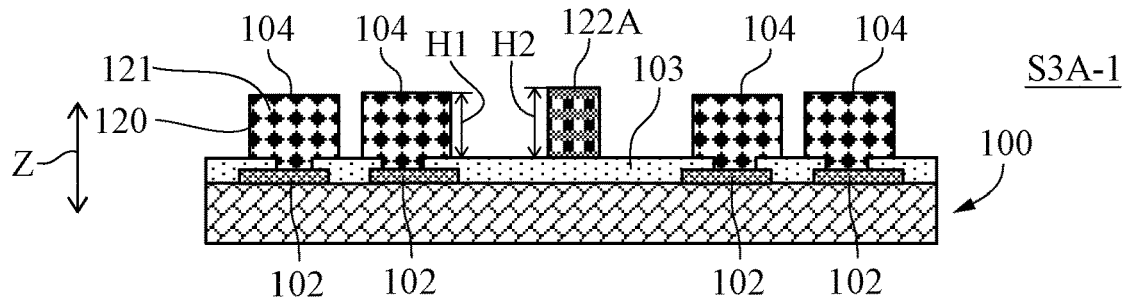
FIG. 7A is a diagram illustrating part of a method of manufacturing the image pickup module of the second embodiment.
Figure 7B:
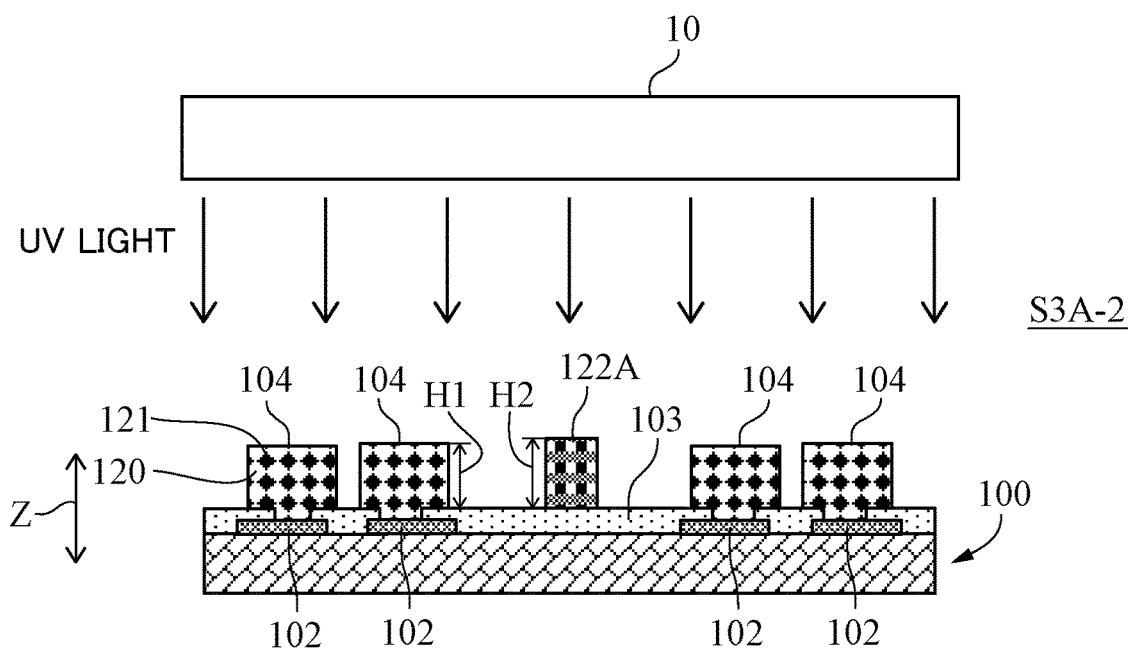
FIG. 7B is a diagram illustrating part of the method of manufacturing the image pickup module of the second embodiment.
Figure 7C:
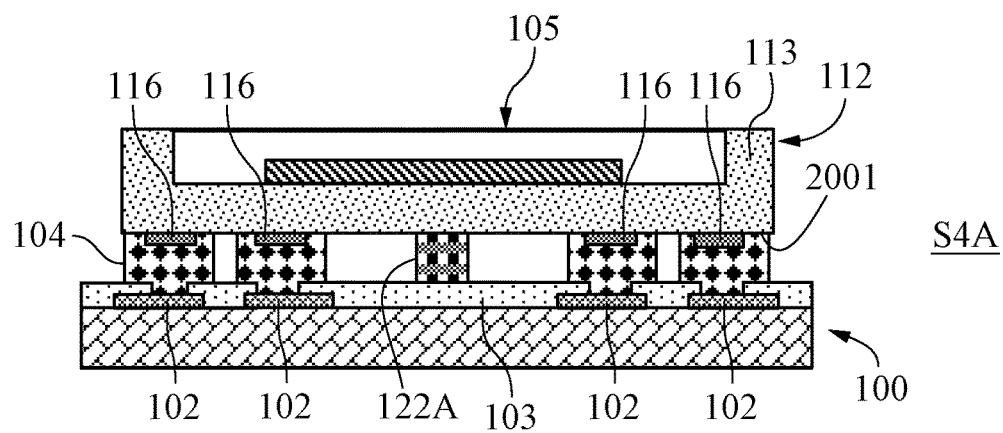
FIG. 7C is a diagram illustrating part of the method of manufacturing the image pickup module of the second embodiment.

Next, an image pickup module that is one example of electronic modules of a second embodiment, and a method of manufacturing the image pickup module will be described. FIG. 6 is a cross-sectional view of an image pickup module 300A of the second embodiment. FIGS. 7A to 7C are diagrams illustrating part of the method of manufacturing the image pickup module 300A of the second embodiment. In the second embodiment, a resin material of a bonding portion 128A illustrated in FIG. 6 is different from that of the bonding portion 128 of the first embodiment. That is, in the second embodiment, the material of second resin 122A illustrated in FIG. 7A and supplied in a manufacturing process is different from that of the second resin 122 of the first embodiment. In the second embodiment, part of the manufacturing method is different, and the other is the same as the first embodiment. In addition, the image pickup module 300A is the same as the image pickup module 300 of the first embodiment except for the bonding portion 128A. An identical component is given an identical symbol. Hereinafter, only features different from the first embodiment will be described, and the description for the same features will be omitted. Note that the number and the arrangement of the bonding portions 128A of the second embodiment are the same as those of the bonding portions 128 of the first embodiment.

A process S3A-1 illustrated in FIG. 7A corresponds to the process S3 of FIG. 3C described in the first embodiment. In the process S3, the second resin 122 supplied to the wiring board 100 is an uncured thermosetting resin. In the second embodiment, however, the second resin 122A supplied to the wiring board 100 in the process S3A-1 is an uncured photocurable resin. That is, in the second embodiment, the bonding portion 128A is a cured product into which the photocurable resin is cured. In the second embodiment, the photocurable resin is an ultraviolet curable resin (hereinafter referred to as a UV curable resin).

The second resin 122A is a precursor of the bonding portion 128A, and is a UV curable resin having delayed cure property. In the UV curable resin having delayed cure property, the curing reaction is started a few seconds or a few minutes later after the resin is irradiated with UV light; or otherwise, triggered by heat applied after the resin is irradiated with UV light. In the second embodiment, the second resin 122A is a UV curable resin having delayed cure property, and the curing reaction occurs when the heat having a temperature of about 40° C., lower than the solder melting point $T_M$, is applied to the second resin 122A after the second resin 122A is irradiated with UV light.

In a process S3A-1 illustrated in FIG. 7A, the second resin 122A is supplied onto the wiring board 100. Preferably, a height H2 of the second resin 122A in the Z direction is equal to or higher than a height H1 of the paste 104 in the Z direction. In addition, the viscosity of the second resin 122A is preferably 10,000 Pa·S or more at a room temperature (23±2° C.).

After the second resin 122A is supplied onto the wiring board 100 in the process S3A-1, the second resin 122A supplied onto the wiring board 100 is irradiated with UV light by a light source 10 in the process S3A-2 of FIG. 7B, before the image sensor 105 is placed on the wiring board 100. In a process S4A of FIG. 7C, the image sensor 105 is placed on the wiring board 100 before the second resin 122A cures, and the wiring board 100 on which the image sensor 105 is placed is conveyed into the reflow furnace. Then, in the process in which the temperature of the paste 104 is increased toward the solder melting point $T_M$ in the time period B of FIG. 5, the second resin 122A is cured and the bonding portion 128A illustrated in FIG. 6 is formed.

As in the first embodiment, since the distance between the image sensor 105 and the wiring board 100 is kept almost constant in the X and Y directions by the bonding portions 128A, the second embodiment produces the same effects as those by the first embodiment. That is, the failure in bonding, such as a short circuit or an open circuit, of the solder portions 109 can be prevented, and the reliability for the bonding in the image pickup module 300A can be improved.

Third Embodiment

Figure 8A:
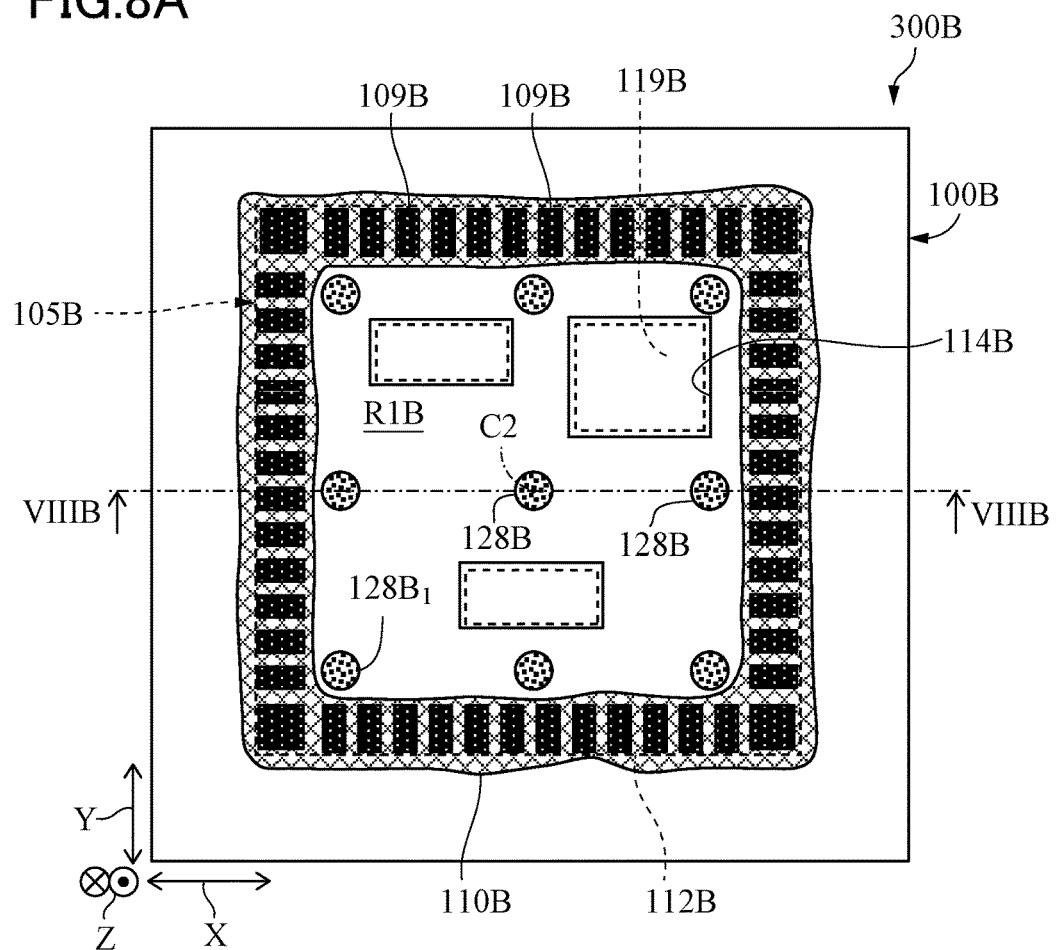
FIG. 8A is a plan view of an image pickup module of a third embodiment.
Figure 8B:
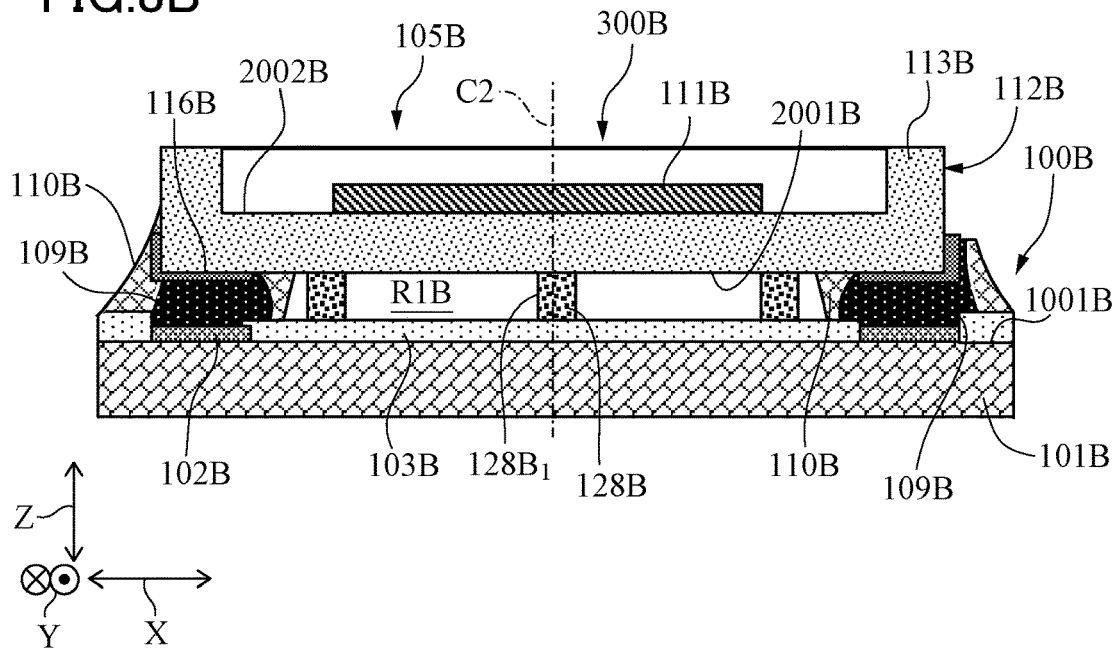
FIG. 8B is a cross-sectional view of the image pickup module of the third embodiment.

Next, an image pickup module of a third embodiment will be described. FIG. 8A is a plan view of the image pickup module of the third embodiment. FIG. 8B is a cross-sectional view of the image pickup module of the third embodiment. The image pickup module of a digital camera, which is one example of electronic devices of the third embodiment, differs in configuration from the image pickup module of the first embodiment. The other configuration of the digital camera of the third embodiment other than the image pickup module is the same as that of the first embodiment. Thus, in the third embodiment, only the image pickup module different from that of the first embodiment will be described, and the description for the other configuration will be omitted. In addition, since the manufacturing method is also the same as that in the first or the second embodiment, the description thereof will be omitted.

An image pickup module 300B of the third embodiment is a full-size image pickup module. The image pickup module 300B includes a wiring board 100B and an image sensor 105B. The image sensor 105B is almost the same in configuration as the image sensor 105 of the first embodiment, but is different in arrangement of lands. Similarly, the wiring board 100B is almost the same in configuration as the wiring board 100 of the first embodiment, but is different in arrangement of lands. FIG. 8A, which is a plan view of the image pickup module 300B, illustrates the image pickup module 300B viewed in a Z direction perpendicular to a mounting surface of the wiring board 100B, on which the image sensor 105B is mounted. In FIG. 8A, the image sensor 105B is illustrated by a broken line, and the image pickup module 300B seen through the image sensor 105B is schematically illustrated. FIG. 8B is a cross-sectional view of the image pickup module 300B of the third embodiment. FIG. 8B schematically illustrates a cross section of the image pickup module 300B, taken along a line VIIIB-VIIIB of FIG. 8A.

The image sensor 105B of the third embodiment is an LCC semiconductor package. The image sensor 105B includes an image pickup device 111B and an interposer 112B. The interposer 112B includes an insulating substrate 113B and a plurality of lands 116B. The plurality of lands 116B is disposed on a main surface 2001B of the insulating substrate 113B. Since the image sensor 105B is an LCC semiconductor package, the plurality of lands 116B is disposed on the outer circumferential edge of the interposer 112B. The image pickup device 111B is disposed on a main surface 2002B of the insulating substrate 113B opposite to the main surface 2001B. Each land 116B is a pad formed by plating the surface of a base body, made of a conductive metal such as copper, with Ni and Au. Each land 116B may be a signal land, a power-source land, a ground land, or a dummy land. The insulating substrate 113B may be a ceramic substrate made of ceramics, such as alumina. The shape of each land 116B viewed in the Z direction is not limited to a particular shape. In the third embodiment, the shape is a rectangle.

The wiring board 100B includes an insulating substrate 101B and a plurality of lands 102B. The plurality of lands 102B is disposed on a main surface 1001B of the insulating substrate 101B. Each land 102B is a pad made of a conductive metal such as copper. Each land 102B may be a signal land, a power-source land, a ground land, or a dummy land. The insulating substrate 101B is made of insulating material, such as epoxy resin.

On the main surface 1001B, a solder resist film 103B is formed. The solder resist film 103B has openings formed at positions corresponding to the lands 102B, for exposing the lands 102B. The shape of each land 102B viewed in the Z direction is not limited to a particular shape. In the third embodiment, the shape is a rectangle. The lands 102B may be SMD lands or NSMD lands with respect to the solder resist film 103B.

The image pickup module 300B is positioned and fixed to a plate (not illustrated) disposed on the housing 611 of FIG. 1. The image sensor 105B includes a land 119B to which a hook portion of the plate (not illustrated) is soldered. The wiring board 100B has an opening 114B formed at a position that faces the land 119B, and having a size larger than the land 119B. The hook portion of the plate (not illustrated) is inserted through the opening 114B and soldered to the land 119B.

The main surface 1001B of the wiring board 100B and the main surface 2001B of the image sensor 105B face each other. The image pickup module 300B includes a plurality of solder portions 109B that electrically and mechanically bonds the image sensor 105B and the wiring board 100B. The solder portions 109B electrically and mechanically bond the lands 116B and the lands 102B that face each other.

The image pickup module 300B includes an underfill portion 110B that is disposed between the image sensor 105B and the wiring board 100B, and that mechanically bonds the image sensor 105B and the wiring board 100B. The underfill portion 110B is made of resin, which is an insulator having electrical insulation property. The underfill portion 110B is a first resin portion that contains resin.

Each of the plurality of solder portions 109B is in contact with the underfill portion 110B formed as one body. Since each solder portion 109B is in contact with the underfill portion 110B, the thermal stress caused by the heat generated in the operation of the image sensor 105B can be dispersed not only to the solder portions 109B, but also to the underfill portion 110B. The image sensor 105B is a full-size large image sensor. Even if such a large image sensor 105B is mounted on the wiring board 100B, the break of the solder portions 109B caused by the thermal stress can be suppressed.

Preferably, the Vickers hardness of the underfill portion 110B is 17 Hv or more. If the Vickers hardness of the underfill portion 110B is 17 Hv or more, the bonding strength of the solder portions 109B can be sufficiently secured.

When viewed in the Z direction, the external shape of the image sensor 105B is rectangular. The external shape of the image sensor 105B viewed in the Z direction is equal to the external shape of the interposer 112B, that is, the external shape of the insulating substrate 113B. When viewed in the Z direction, the wiring board 100B is larger than the image sensor 105B. When viewed in the Z direction, the whole of the image sensor 105B is in the wiring board 100B. When viewed in the Z direction, the plurality of solder portions 109B is disposed so as to surround a center C2 of the image sensor 105B, that is, a center C2 of the interposer 112B. Specifically, when viewed in the Z direction, the plurality of solder portions 109B is disposed so as to surround a rectangular region that includes the center C2 of the interposer 112B. When viewed in the Z direction, the center C2 is a centroid of the area of the main surface 2001B of the image sensor 105B. In FIG. 8B, the center C2 is indicated by a dot-and-dash imaginary line that extends in the Z direction. Since the image sensor 105B is an LCC semiconductor package, the area of the rectangular region of the image sensor 105B is larger than the area of the rectangular region of the image sensor 105 according to the first embodiment, which is an LGA semiconductor package.

The underfill portion 110B is formed among the plurality of solder portions 109B so as to be in contact with each solder portion 109B. When viewed in the Z direction, the underfill portion 110B is disposed so as to surround the center C2. Thus, a region R1B including the center C2 and having no underfill portion 110B is formed inside the underfill portion 110B. The region R1B is a first region. When viewed in the Z direction, the region R1B is in the interposer 112B of the image sensor 105B. The area of the region R1B illustrated in FIG. 8A and viewed in the Z direction is larger than the area of the region R1 illustrated in FIG. 2A and viewed in the Z direction.

The image pickup module 300B includes at least one bonding portion disposed between the interposer 112B of the image sensor 105B and the wiring board 100B for mechanically bonding the interposer 112B and the wiring board 100B. In the third embodiment, the at least one bonding portion is a plurality of bonding portions 128B. For example, the at least one bonding portion is nine bonding portions 128B. Each bonding portion 128B is made of resin, which is an insulator having electrical insulation property. Each bonding portion 128B is a second resin portion that contains resin.

Each bonding portion 128B bonds the main surface 2001B of the image sensor 105B and the solder resist film 103B of the wiring board 100B. Each bonding portion 128B functions as a member that suppresses the change in distance between the image sensor 105B and the wiring board 100B in the manufacturing process for the image pickup module 300B.

The plurality of bonding portions 128B is made of an identical resin material. When viewed in the Z direction, at least one of the plurality of bonding portions 128B is disposed in the region R1B. In the third embodiment, when viewed in the Z direction, all of the bonding portions 128B are disposed in the region R1B. Thus, the plurality of bonding portions 128B is a plurality of bonding portions $128B_1$ disposed in the region R1B when viewed in the Z direction. Each bonding portion $128B_1$ is a first bonding portion. Preferably, one of the plurality of bonding portions $128B_1$ is disposed at a position that overlaps with the center C2 when viewed in the Z direction.

Note that although each bonding portion 128B bonds the main surface 2001B of the insulating substrate 113B of the image sensor 105B and the solder resist film 103B of the wiring board 100B in the present embodiment, the present disclosure is not limited to this. For example, some of the plurality of bonding portions 128B may bond the main surface 1001B or lands 102B of the wiring board 100B and lands 116B.

The Vickers hardness of the bonding portions 128B is preferably 20 Hv or more for keeping the distance between the image sensor 105B and the wiring board 100B and reducing the stress applied to the solder portions 109B in the heating process of the manufacturing process. That is, it is preferable that the Vickers hardness of the bonding portions 128B be higher than that of the underfill portion 110B. In other words, it is preferable that the Vickers hardness of the underfill portion 110B be lower than that of the bonding portions 128B.

Since the method of manufacturing the image pickup module 300B in the third embodiment is the same as the manufacturing method in the first or the second embodiment, the description thereof will be omitted. By the way, the bonding portions $128B_1$ illustrated in FIG. 8A play a supplementary role to keep the distance between the image sensor 105B and the wiring board 100B in the heating process. For this reason, the total volume of the bonding portions $128B_1$ is preferably smaller than the total volume of the underfill portion 110B. That is, the total volume of the second resin supplied to the wiring board 100B in the manufacturing process is preferably smaller than the total volume of the paste supplied to the wiring board 100B.

As in the first or the second embodiment, since the distance between the image sensor 105B and the wiring board 100B is kept almost constant in the X and Y directions by the bonding portions 128B, the third embodiment produces the same effects as those by the first or the second embodiment. That is, the failure in bonding, such as a short circuit or an open circuit, of the solder portions 109B can be prevented, and the reliability for the bonding in the image pickup module 300B can be improved.

Modifications

In the first embodiment, the description has been made for the case where the image pickup module 300 includes at least one bonding portion, and where the at least one bonding portion includes the one bonding portion $128_1$ disposed in the region R1 and the plurality of bonding portions $128_2$ disposed in the region R2. However, the present disclosure is not limited to this. In the third embodiment, the description has been made for the case where the image pickup module 300B includes at least one bonding portion, and where the at least one bonding portion includes the plurality of bonding portions $128B_1$ disposed in the region R1B. However, the present disclosure is not limited to this. Hereinafter, some modifications of the image pickup module 300 of the first embodiment will be described. FIGS. 9A, 9B, 10A, and 10B illustrate the modifications of the image pickup module 300 of the first embodiment.

Figure 9A:
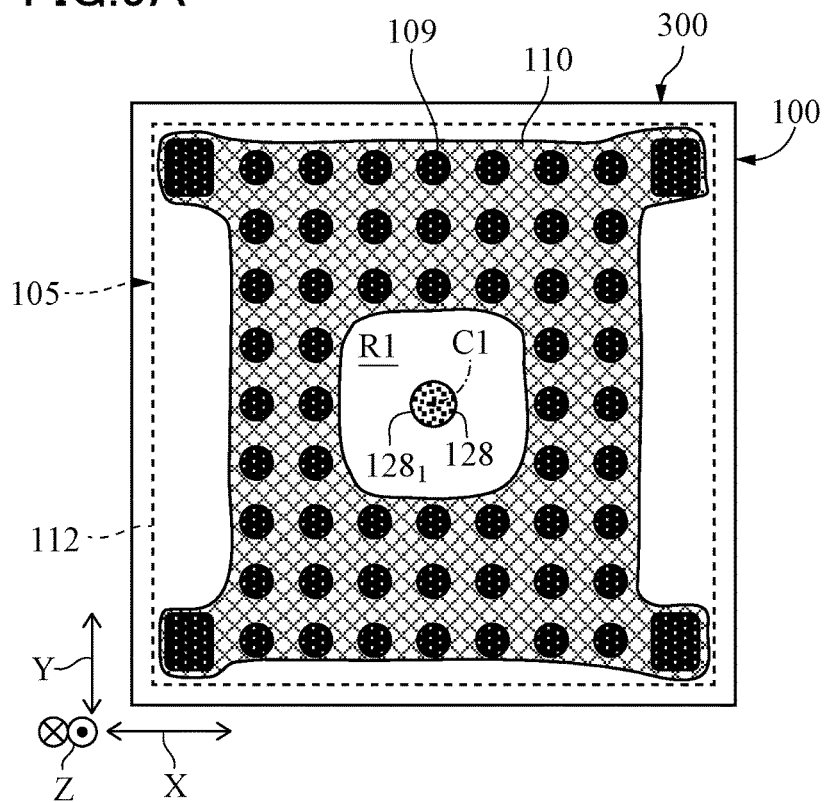
FIG. 9A is a diagram illustrating an image pickup module of a modification.

An image pickup module 300 of a modification illustrated in FIG. 9A includes only one bonding portion 128. As illustrated in FIG. 9A, the bonding portion 128 is a bonding portion $128_1$ disposed in the region R1. That is, the image pickup module 300 of the modification illustrated in FIG. 9A includes the one bonding portion $128_1$ disposed in the region R1, as at least one bonding portion.

Figure 9B:
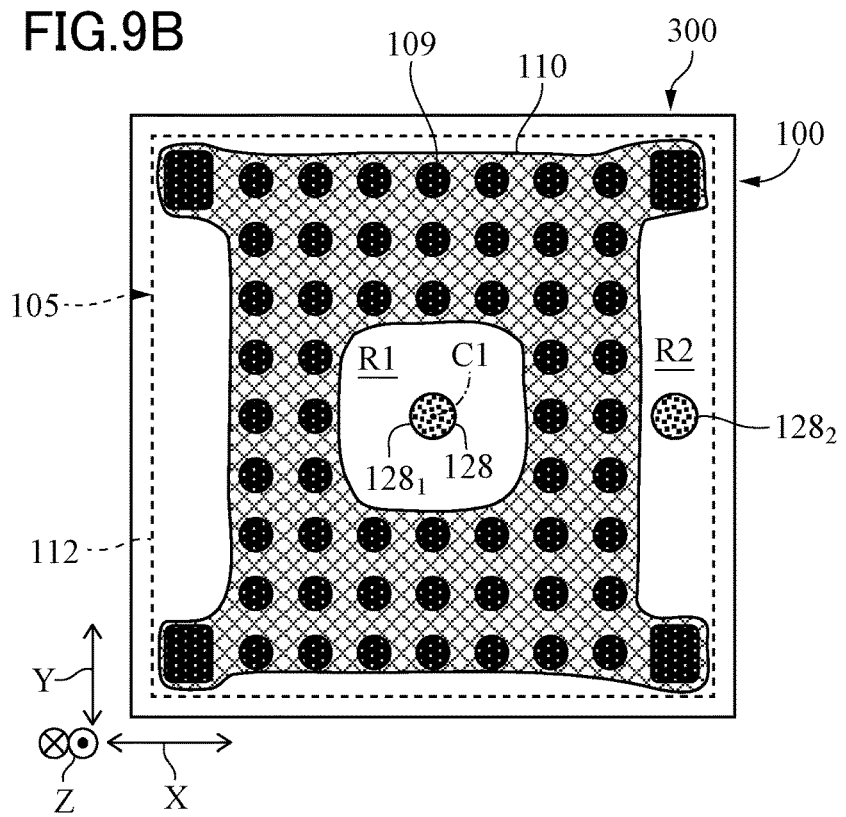
FIG. 9B is a diagram illustrating an image pickup module of a modification.

An image pickup module 300 of a modification illustrated in FIG. 9B includes two bonding portions 128. As illustrated in FIG. 9B, one of the two bonding portions 128 is a bonding portion $128_1$ disposed in the region R1, and the other one is a bonding portion $128_2$ disposed in the region R2. That is, the image pickup module 300 of the modification illustrated in FIG. 9B includes the one bonding portion $128_1$ disposed in the region R1 and the other one bonding portion $128_2$ disposed in the region R2, as at least one bonding portion.

Figure 10A:
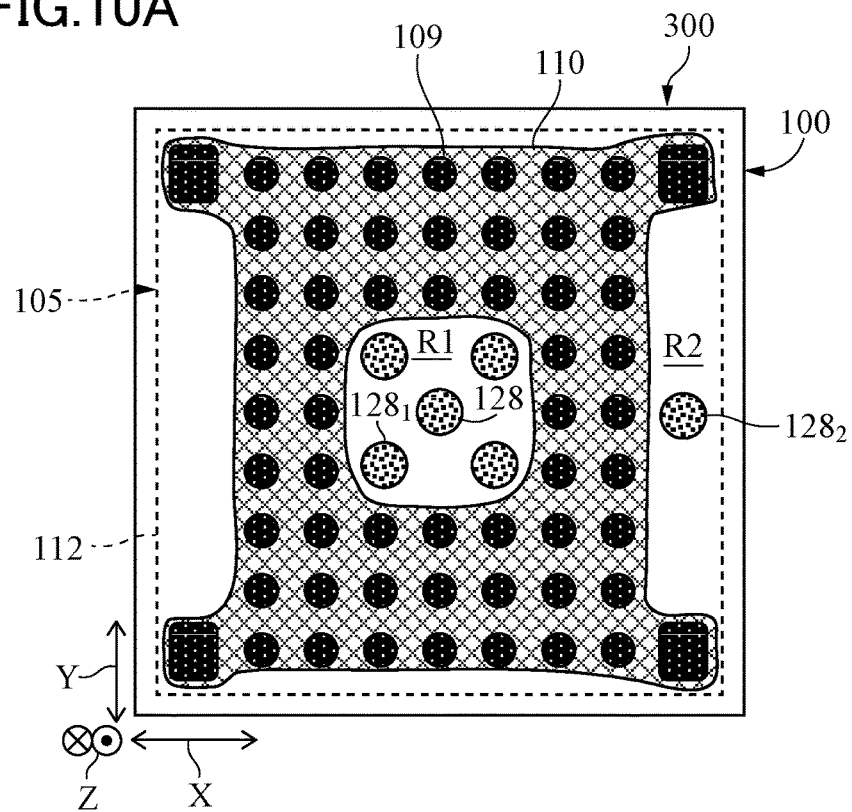
FIG. 10A is a diagram illustrating an image pickup module of a modification.

An image pickup module 300 of a modification illustrated in FIG. 10A includes three or more bonding portions 128. As illustrated in FIG. 10A, among the three or more bonding portions 128, two or more bonding portions 128 are bonding portions $128_1$ disposed in the region R1, and the other one is a bonding portion $128_2$ disposed in the region R2. That is, the image pickup module 300 of the modification illustrated in FIG. 10A includes the plurality of bonding portions $128_1$ disposed in the region R1 and the other one bonding portion $128_2$ disposed in the region R2, as at least one bonding portion.

Figure 10B:
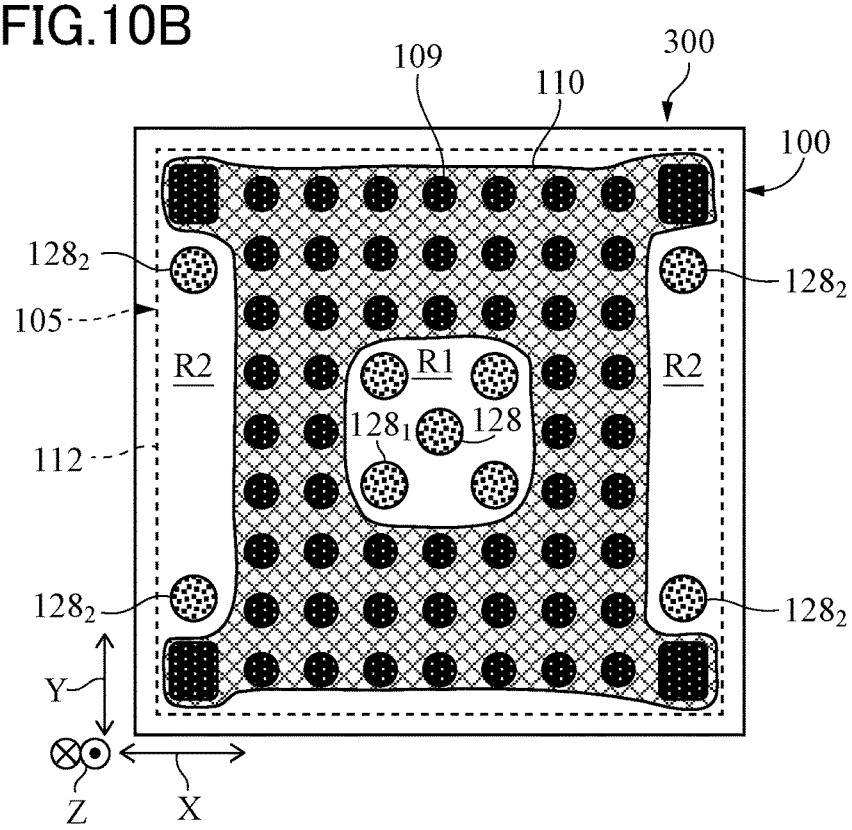
FIG. 10B is a diagram illustrating an image pickup module of a modification.

An image pickup module 300 of a modification illustrated in FIG. 10B includes four or more bonding portions 128. As illustrated in FIG. 10B, among the four or more bonding portions 128, two or more bonding portions 128 are bonding portions $128_1$ disposed in the region R1, and the other two or more are bonding portions $128_2$ disposed in the region R2. That is, the image pickup module 300 of the modification illustrated in FIG. 10B includes the plurality of bonding portions $128_1$ disposed in the region R1 and the plurality of bonding portion $128_2$ disposed in the region R2, as at least one bonding portion.

As described in the first to the third embodiments and the modifications, the image pickup module includes at least one bonding portion, and at least one of the at least one bonding portion is disposed in the first region formed inside the underfill portion.

EXAMPLES

Hereinafter, specific examples of the above-described embodiments will be described.

Example 1

In Example 1, the image pickup module 300 of the first embodiment was manufactured by using the manufacturing method of the first embodiment. Hereinafter, Example 1 will be described with reference to FIGS. 2A, 2B, 3A to 3D, 4A to 4D, and 5.

First, the wiring board 100 and the image sensor 105 prepared for manufacturing the image pickup module 300 will be described.

The type of the insulating substrate 101 of the wiring board 100 was FR-4. The size of the outer shape of the insulating substrate 101 was about 50.0 mm×50.0 mm. The material of the lands 102 was copper. The diameter of the lands 102 was 1.0 mm. The pitch of the plurality of lands 102 disposed like a grid was 1.6 mm. The thickness of the solder resist film 103 was about 0.02 mm. In addition, electronic components such as capacitors and resistors (both not illustrated) were mounted on the back side of the wiring board 100.

The image sensor 105 was an LGA package. The material of the insulating substrate 113 of the image sensor 105 was alumina ceramics. The material of the base body of each land 116 was copper. The surface of the base body was plated with Au and Ni.

The area of the main surface 2001 of the image sensor 105 was 900 mm$^2$. The number of the plurality of lands 116 was 300. The total area of the plurality of lands 116 was 150 mm$^2$. The area of the rectangular region surrounded by the innermost lands 116 of all of the lands 116 was 180 mm$^2$.

In the process S2 illustrated in FIG. 3B, the paste 104 was screen-printed on the lands 102 of the wiring board 100 so as to cover the lands 102. In the screen printing, a printing plate with a thickness of 0.02 mm was used.

In the thermosetting resin, which is the first resin 121 of the paste 104, the bisphenol A epoxy resin and a curing agent that reacts with the epoxy resin were contained. The alloy composition of the solder powder 120 contained in the paste 104 was tin-58bismuth eutectic whose melting point is 139° C. The average particle diameter of the solder powder 120 was 40 μm. The additive amount of the solder powder 120 to the paste 104 was 40 vol %. In the rest of the paste 104, the first resin 121 and a slight amount of flux component were contained.

In the process S3 illustrated in FIG. 3C, the second resin 122 having a size of 12 mm was applied by using a dispenser, onto five portions of the wiring board 100 so as not to contact the lands 102. The second resin 122 is a precursor of the bonding portion 128. When viewed in the Z direction, one of the five portions was positioned at the centroid of the image sensor 105 to be mounted on the wiring board 100. When viewed in the Z direction in a state where the image sensor 105 was placed on the wiring board 100, the other four of the five portions were in the image sensor 105, and were positioned in the vicinity of corner portions of the image sensor 105. The height H2 of the second resin 122 having been applied onto the wiring board 100 was equal to or higher than the height H1 of the paste 104. The second resin 122 used was a thermosetting resin that starts the curing reaction at a temperature equal to or higher than about 70° C. The total volume of the second resin 122 supplied to the wiring board 100 in the process S3 was smaller than the total volume of the paste 104 supplied to the wiring board 100 in the process S2.

In the process S4 illustrated in FIG. 3D, the image sensor 105 was positioned by using a mounter so that the lands 116 face the lands 102, and was placed on the wiring board 100 to which the paste 104 and the second resin 122 had been supplied.

The wiring board 100 on which the image sensor 105 was placed was conveyed into the reflow furnace, and the image sensor 105 and the wiring board 100 were heated. The temperature profile of the heating process was the temperature profile P0 illustrated in FIG. 5.

The temperature-increase rate of the interior of the reflow furnace in the time period B of FIG. 5 was 1° C./sec. When the temperature of the interior of the reflow furnace reached about 70° C., the curing rate of the second resin 122 became about 80% and the bonding portions 128 was formed. After that, the distance between the wiring board 100 and the image sensor 105 was kept almost constant in the X and Y directions by the bonding portion 128.

Then, the image sensor 105 and the wiring board 100 were heated in the time period C until the temperature of the wiring board 100 reached the peak temperature $T_P$ of 160° C. higher than the solder melting point $T_M$, and thereby the solder contained in the paste 104 was melted. Since the solder melting point $T_M$ is 139° C., the peak temperature $T_P$ is 1.15 times the solder melting point $T_M$. In the time period C, as illustrated in FIG. 4B, the solder powder 120 of the paste 104 melted and aggregated, so that the molten solder 107 and the first resin 121 that is a thermosetting resin were separated from each other. In the time period C, the temperature-increase rate of the interior of the reflow furnace was 0.5° C./sec. Since the distance between the wiring board 100 and the image sensor 105 was kept almost constant by the bonding portion 128, the flow of the first resin caused by the capillary phenomenon was prevented, and the first resin 121 remained around the molten solder 107.

After the molten solder 107 and the first resin 121 were separated from each other, the image sensor 105 and the wiring board 100 were cooled in the time period D until the temperature of the wiring board 100 decreased from the peak temperature $T_P$ to the solder melting point $T_M$. With this operation, the molten solder 107 was solidified, and the solder portions 109 were formed as illustrated in FIG. 4C. In the time period D, the temperature-decrease rate was 2° C./sec. In the time periods C and D, the maximum curing rate of the first resin 121 was 10%. Thus, the solder completely solidified before the curing rate of the first resin 121 reached 50% and the first resin 121 cured.

Then, the image sensor 105 and the wiring board 100 were continuously cooled in the time period E, to 120° C. at the same temperature-decrease rate as that in the time period D; and the temperature of 120° C. was kept for 20 minutes. With this operation, the first resin 121 was completely cured, and the image pickup module 300 illustrated in FIG. 4D was obtained.

Example 2

In Example 2, the image pickup module 300A of the second embodiment was manufactured by using the method of the second embodiment. Hereinafter, Example 2 will be described with reference to FIGS. 6, and 7A to 7C. Note that the wiring board 100, the image sensor 105, and the paste 104 prepared for Example 2 were the same as those of Example 1.

The second resin 122A applied onto the wiring board 100 in the process S3A-1 of FIG. 7A was a UV curable resin having delayed cure property. The UV curable resin having delayed cure property contains UV-curable epoxy-based resin, bisphenol A epoxy resin, photopolymerization initiator, adjuvant for adhesion, and viscosity modifier; and starts the curing reaction when the heat having a temperature of about 40° C. is applied after the UV curable resin is irradiated with UV light. In the process S3A-2 of FIG. 7B, before the image sensor 105 was placed on the wiring board 100, the second resin 122A applied onto the wiring board 100 was irradiated with UV light having a luminous intensity of 300 mW/cm², for 2.5 seconds.

After that, as illustrated in FIG. 7C, the image sensor 105 was placed on the wiring board 100, then the wiring board 100 on which the image sensor 105 was placed was conveyed into the reflow furnace, and then the image sensor 105 and the wiring board 100 were heated. The temperature profile of the heating process was the temperature profile P0 illustrated in FIG. 5, as in Example 1. In the time period B of the temperature profile P0, the curing reaction of the second resin 122A started at a temperature of about 40° C., and the curing rate of the second resin 122 became 80% at a temperature of about 70° C.

After that, the image sensor 105 and the wiring board 100 were heated under the same temperature profile P0 as that of Example 1, and the image pickup module 300A of Example 2 was obtained.

Example 3

In Example 3, the image pickup module 300B of the third embodiment was manufactured by using the method of the third embodiment. Hereinafter, Example 3 will be described with reference to FIGS. 8A and 8B. First, the wiring board 100B and the image sensor 105B prepared for manufacturing the image pickup module 300B will be described.

The type of the insulating substrate 101B of the wiring board 100B was FR-4. The size of the outer shape of the insulating substrate 101B was about 66.0 mm×45.0 mm. The material of the lands 102B was copper. The size of each land 102B was 2.4 mm×0.76 mm. The number of the plurality of lands 102B was 142. The pitch of the plurality of lands 102B disposed like a grid was 1.0 mm. The thickness of the solder resist film 103B was about 0.02 mm.

The image sensor 105B was an LCC package. The material of the insulating substrate 113B of the image sensor 105B was alumina ceramics. The material of the base body of each land 116B was copper. The surface of the base body was plated with Au and Ni.

Each land 116B was L-shaped, and disposed across a boundary between the bottom surface and a side-wall surface of the insulating substrate 113B. The size of a portion of each land 116B disposed on the bottom surface was 1.8 mm×0.6 mm. The size of a portion of each land 116B disposed on the side-wall surface was 1.0 mm×0.6 mm. The pitch of the plurality of lands 116B was 1.0 mm. The size of the land 119B was about 7 mm×4 mm.

The full-size image pickup module 300B of Example 3 was obtained by using the same manufacturing method as that of Example 2. In Example 3, nine bonding portions 128B were formed in the region R1B. One of the nine bonding portions 128B was disposed in the vicinity of the centroid of the image sensor 105B mounted on the wiring board 100B. Eight of the nine bonding portions 128B were disposed, spaced from each other, in an edge portion of the region R1B, which includes corner portions of the region R1B.

Since the bonding portions 128B are disposed at nine positions, the warpage of the wiring board 100B of the large image pickup module 300B, such as a full-size image pickup module, can be effectively suppressed. Thus, the distance between the wiring board 100B and the image sensor 105B can be kept constant at any position in the in-plane direction. Evaluation of Image Pickup Modules of Example 1 to Example 3

First, the Vickers hardness of the bonding portion and the underfill portion of Example 1 to Example 3 was evaluated. The method by which the Vickers hardness of the underfill portion 110 and the bonding portion 128 of the image pickup module 300 of Example 1 was evaluated will be described. First, the image pickup module 300 was disassembled, and the underfill portion 110 and the five bonding portions 128 were taken out. Then, the Vickers hardness of ten portions of the underfill portion 110 (that was taken out) was measured, and a plurality of measurement values were obtained. Similarly, the Vickers hardness of ten portions of each of the five bonding portions 128 (that were taken out) was measured, and a plurality of measurement values were obtained. The measuring instrument used was a Vickers hardness testing system (Micro Vickers Hardness Testing System HM-102 made by Mitutoyo Corporation). The test force was 0.01 N. An average value of the plurality of measurement values of the underfill portion 110 was determined as the Vickers hardness of the underfill portion 110. Similarly, an average value of the plurality of measurement values of each of the bonding portions 128 was determined as the Vickers hardness of each bonding portion 128. In addition, the Vickers hardness for the image pickup module 300A of Example 2 and the Vickers hardness for the image pickup module 300B of Example 3 were measured by using the same method as that of Example 1.

The Vickers hardness of the bonding portion 128 and the Vickers hardness of the underfill portion 110 were both 17 Hv in Example 1. The Vickers hardness of the bonding portion 128A of Example 2 was 23 Hv. The Vickers hardness of the underfill portion 110 of Example 2 was 20 Hv. The Vickers hardness of the bonding portion 128B of Example 3 was 23 Hv. The Vickers hardness of the underfill portion 110B of Example 3 was 20 Hv.

An appearance test was visually performed. In the appearance test, all the solder portions of Example 1 to Example 3 were covered by the cured product into which the thermosetting resin had cured, and thereby reinforced. In another appearance test, the image sensor of each image pickup module of Example 1 to Example 3 was pulled off from the wiring board and disassembled for the appearance test. Also in the other appearance test, it was confirmed that the thermosetting resin had adhered to the main surface of the image sensor and the solder portions were reinforced.

The solder portions 109 of the image pickup module 300 of Example 1, the solder portions 109 of the image pickup module 300A of Example 2, and the solder portions 109B of the image pickup module 300B of Example 3 were observed by using an X-ray transmission apparatus. As a result, it was confirmed that the solder portions 109 of Example 1, the solder portions 109 of Example 2, and the solder portions 109B of Example 3 had not flowed out of the resin by breaking the resin. In addition, there was no short-circuit caused by solder bridge, and no electrical error.

In any of Example 1 to Example 3, since the process to completely cure the first resin was performed at temperatures lower than the solder melting point, the amount of thermal deformation of the image sensor was small, and the optical performance of the built-in image pickup device was sufficiently ensured.

Comparative Example 1

In Comparative Example 1, an image pickup module having no bonding portion 128 of Example 1 was manufactured. The image pickup module of Comparative Example 1 is the same as the image pickup module 300 of Example 1, except that the bonding portion 128 is not provided. In addition, the manufacturing process for the image pickup module of Comparative Example 1 is the same as that for the image pickup module 300 of Example 1, except that the process to supply the second resin 122 to the wiring board 100 is not performed.

Comparative Example 2

In Comparative Example 2, an image pickup module having no bonding portion 128B of Example 3 was manufactured. The image pickup module of Comparative Example 2 is the same as the image pickup module 300B of Example 3, except that the bonding portion 128B is not provided. In addition, the manufacturing process for the image pickup module of Comparative Example 2 is the same as that for the image pickup module 300B of Example 3, except that the process to supply the second resin 122B to the wiring board 100B is not performed.

Comparative Example 3

In Comparative Example 3, the image sensor 105B and the wiring board 100B that are the same as those of Example 3 were used, and a thermosetting resin that starts to cure at about 100° C. was used as the second resin. By using these components and resin, an image pickup module was manufactured in the same manufacturing process as that for Example 3.

When the curing rate of the second resin in the heating process was evaluated in Comparative Example 3, the curing rate was about 10% in the time period B of FIG. 5, and was about 30% or less and in an almost liquid-phase state even at the end of the time period D. The curing rate of the second resin became 90% or more, through the time periods E and F.

Evaluation of Image Pickup Modules of Comparative Examples 1 to 3

The image pickup modules of Comparative Examples 1 to 3 were evaluated. In Comparative Examples 1 and 2, the bonding portions were not provided. In Comparative Example 3, the Vickers hardness of the bonding portions was 5 Hv.

The solder portions of each image pickup module of Comparative Examples 1 to 3 were observed by using an X-ray transmission apparatus. In each image pickup module of Comparative Examples 1 to 3, bridges were formed between adjacent pieces of solder, and a failure in continuity was found through electric check. In particular, more bridges were formed between adjacent pieces of solder in Comparative Example 3, than in Comparative Examples 1 and 2.

In addition, in Comparative Examples 1 to 3, there were more portions of the solder portions on which the cured product of the thermosetting resin was not formed. In Comparative Example 3, the resin of the bonding portion and the resin of the underfill portion mixed with each other, and flowed to the land 119B illustrated in FIG. 8A. For this reason, the plate (not illustrated) used for positioning was not able to be soldered to the land 119B.

The present invention is not limited to the above-described embodiments, and can be modified within a technical spirit of the present invention. In addition, the effects described in the embodiments are merely examples of the most suitable effects produced by the present invention. Thus, the effects of the present invention are not limited to the effects described in the embodiments.

In the above-described embodiments, the description has been made for the case where the electronic module is an image pickup module and the electronic component is an image sensor. The present disclosure, however, is not limited to this. For example, the present invention can also be applied for the processing module 700 illustrated in FIG. 1. In this case, the processing module 700 is the electronic module, and the image processing device 800 is the electronic component. In addition, the present invention can also be applied for a case where the electronic component is a semiconductor device such as a memory IC (integrated circuit) or a power-source IC. In addition, the present invention can also be applied for an electronic component other than the semiconductor device, as long as the electronic component has a plurality of external terminals of LGA, LCC, or BGA, and the plurality of external terminals is disposed so as to surround the center portion, not disposed in the center portion.

In the above-described embodiments, the description has been made for the digital camera that is one example of electronic devices. The present disclosure, however, is not limited to this. For example, the present invention can also be applied for any electronic devices such as mobile communication devices, including smartphones, tablets, and game machines, wearable devices, and image forming apparatuses.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-201679, filed Nov. 6, 2019, which is hereby incorporated by reference herein in its entirety.

What is claimed is:

1. An electronic module comprising:
   a wiring board;
   an electronic component comprising a semiconductor element and an interposer;
   a plurality of solder portions disposed such that the solder portions surround a center of the interposer in a plan view, and configured to bond the wiring board and the interposer;
   an underfill portion having an electrical insulation property, disposed such that the underfill portion surrounds the center of the interposer in the plan view, and configured to be in contact with the plurality of solder portions; and
   at least one first bonding portion having an electrical insulation property and a material different from a material of the underfill portion, disposed in a first region inside the underfill portion, and configured to bond the interposer and the wiring board.

2. The electronic module according to claim 1, wherein a Vickers hardness of the at least one first bonding portion is higher than a Vickers hardness of the underfill portion.

3. The electronic module according to claim 1, wherein the at least one first bonding portion comprises a plurality of first bonding portions.

4. The electronic module according to claim 1, wherein a total volume of the at least one first bonding portion is smaller than a total volume of the underfill portion.

5. The electronic module according to claim 1, wherein the at least one first bonding portion is a cured product of a thermosetting resin or a photocurable resin.

6. The electronic module according to claim 1, further comprising at least one second bonding portion having an electrical insulation property, disposed in a second region outside the underfill portion, and configured to bond the interposer and the wiring board.

7. The electronic module according to claim 6, wherein a Vickers hardness of the at least one second bonding portion is higher than a Vickers hardness of the underfill portion.

8. The electronic module according to claim 6, wherein the at least one second bonding portion comprises a plurality of second bonding portions.

9. The electronic module according to claim 6, wherein a total volume of the at least one first bonding portion and the at least one second bonding portion is smaller than a total volume of the underfill portion.

10. The electronic module according to claim 6, wherein the at least one second bonding portion is a cured product of a thermosetting resin or a photocurable resin.

11. The electronic module according to claim 1, wherein the semiconductor element is an image pickup device.

12. An electronic device comprising:
    a housing; and
    the electronic module according to claim 1 and disposed in the housing.

* * * * *